United States Patent [19]
Sumi et al.

[11] Patent Number: 5,312,505
[45] Date of Patent: May 17, 1994

[54] FILM PEELING METHOD AND APPARATUS FOR PRACTICING SAME

[75] Inventors: Shigeo Sumi, Saitama; Fumio Hamamura, Kanagawa; Mitsuhiro Seki; Ichio Fukuda, both of Tokyo, all of Japan

[73] Assignee: Somar Corporation, Tokyo, Japan

[21] Appl. No.: 979,430

[22] Filed: Nov. 19, 1992

Related U.S. Application Data

[63] Continuation of Ser. No. 622,981, Dec. 6, 1990, abandoned.

[30] Foreign Application Priority Data

Apr. 6, 1990 [JP] Japan .................................. 2-91555
Sep. 1, 1990 [JP] Japan .................................. 2-231924

[51] Int. Cl.⁵ .............................................. B32B 35/00
[52] U.S. Cl. ..................................... 156/584; 156/344; 156/350
[58] Field of Search ........................ 156/344, 350, 584

[56] References Cited

U.S. PATENT DOCUMENTS

| | | | |
|---|---|---|---|
| 3,776,075 | 12/1973 | Matthews | 83/110 |
| 4,033,403 | 7/1977 | Senton et al. | 184/136 X |
| 4,183,751 | 1/1980 | Matsumoto et al. | 156/344 X |
| 4,724,032 | 2/1988 | Kay | 156/584 X |
| 4,770,737 | 9/1988 | Seki | 156/584 |
| 4,976,766 | 12/1990 | Kuster et al. | 65/289 |

FOREIGN PATENT DOCUMENTS

| | | |
|---|---|---|
| 255129 | 2/1988 | European Pat. Off. . |
| 339570 | 11/1989 | European Pat. Off. . |
| 2181094 | 4/1987 | United Kingdom . |

*Primary Examiner*—David A. Simmons
*Assistant Examiner*—Mark A. Osele
*Attorney, Agent, or Firm*—Sughrue, Mion, Zinn, Macpeak & Seas

[57] ABSTRACT

A film peeling apparatus is disclosed wherein a base plate stuck with the films is conveyed to a film peeling position, where a contact tightness of leading edges of the films to the base plate is reduced by a film contact tightness reducer while relative moving speed of the base plate and the reducer is decreased by slowing down the conveyance speed of the base plate or by moving the reducer in synchronism with the conveyance of the base plate without stopping the conveyance of the base plate.

3 Claims, 24 Drawing Sheets

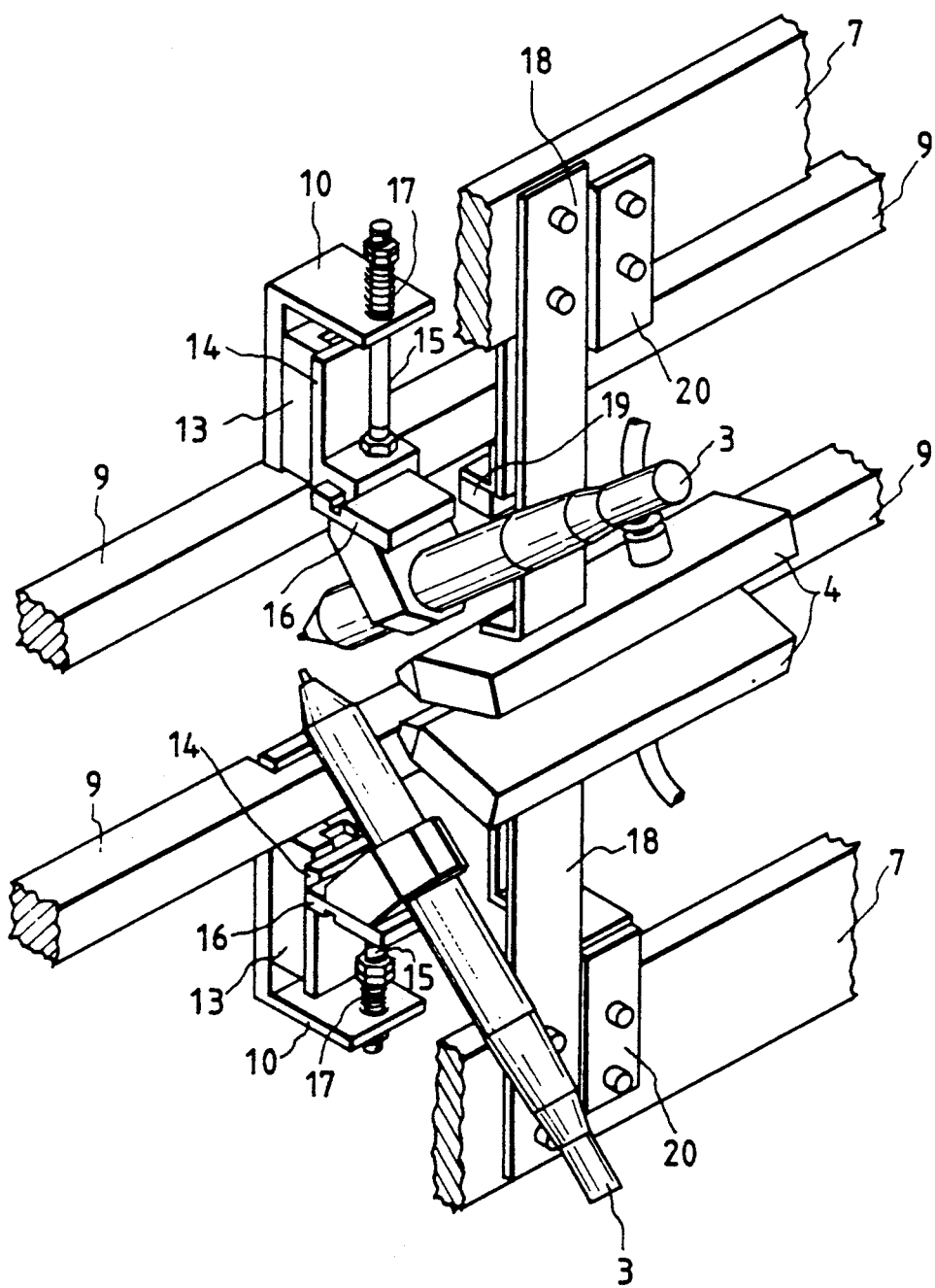

FIG. 6C(b)

| Label | Time | Description |
|---|---|---|
| Y3202 — TD33 | | STEP 2 PROCEEDING |
| T043 — DTF9 — CU34 | .1S (0056) | NO. OF SWING OP. OF SCRATCHER COUNTER |
| Y3204 — CL34 | (0057) | CLEAR VALUE OF COUNTER CU34 |
| Y3204 — TD35 | (0058) | STEP 2 PROCEEDING |
| Y3207 — TD36 | .1S (0059) | TIME LAG OF PINCHING OPERATION OF FILM CATCH BELT AFTER FILM IS SEPARATED |
| Y3203 — R37 R38 Y3200 | .1S (0060) | |
| R37 — TD37 | (0061) | NOZZLE AIR BLOWING OFF STEP PROCEEDING |
| TD57 — R38 R39 Y3200 | .1S 6 (0062) | CONTROL THE TIMING OF NOZZLE AIR BLOWING OFF |
| R38 — TD38 | | NOZZLE AIR BLOWING OFF STEP PROCEEDING |
| TD38 — TD39 Y3200 | .1S 2 (0063) | CONTROL THE TIMING OF NOZZLE AIR BLOWING OFF |
| R39 — TD42 | | NOZZLE AIR BLOWING OFF STEP PROCEEDING |
| Y3207 — TD39 | .1S 5 | CONTROL THE CONTINUOUS TIME OF NOZZLE AIR BLOWING OPERATION |
| — TD40 | .1S 50 (0064) | CONTROL THE TIMING OF NOZZLE AIR BLOWING OFF |
| Y3210 — TD41 | .1S (0065) | STEP 2 PROCEEDING |
| Y3206 — TD50 | .1S 6 (0066) | STEP 2 PROCEEDING |
| — TD55 | .1S 5 | TIME LAG OF DETECTING THE FILM PEELING |
| Y3203 — TD44 | .1S 2 (0067) | TIMING OF DETECTING THE FILM PEELING |
| Y3203 — TD43 | .1S (0068) | STEP 2 PROCEEDING |
| Y4 — Y3114 | .1S (0069) | STEP 2 PROCEEDING |
| Y3201 — TD46 | .1S (0070) | DELAY TIMER OF STOPPING MOTOR M4 AFTER OPERATION |
| Y3207 — TD47 | .1S 13 (0071) | TIME LAG OF SETTING THE AIR NOZZLE ANGLE ON ORIGINAL OPERATION AFTER DETECTING THE FILM PEELING |
| Y3208 — TD48 | .1S 2 (0072) | TIMING OF CHECKING THE MOVING THE SUBS. AFTER THE FILM PEELING |
| — TD49 | .1S 20 | TIME LAG OF CHECK FILM PEELING UNTIL SECOND TIME THEREOF |
| Y3112 — TD63 | .1S (0073) | BACKUP OF OPER. OF DETECTING THE END OF FILM (OVERTIME SETTING) |
| Y3209 — R311 — TD80 | .1S 60 (0080) .1S 10 | TIMING OF DOUBLE CHECK OF DETECTING THE FILM PEELING |

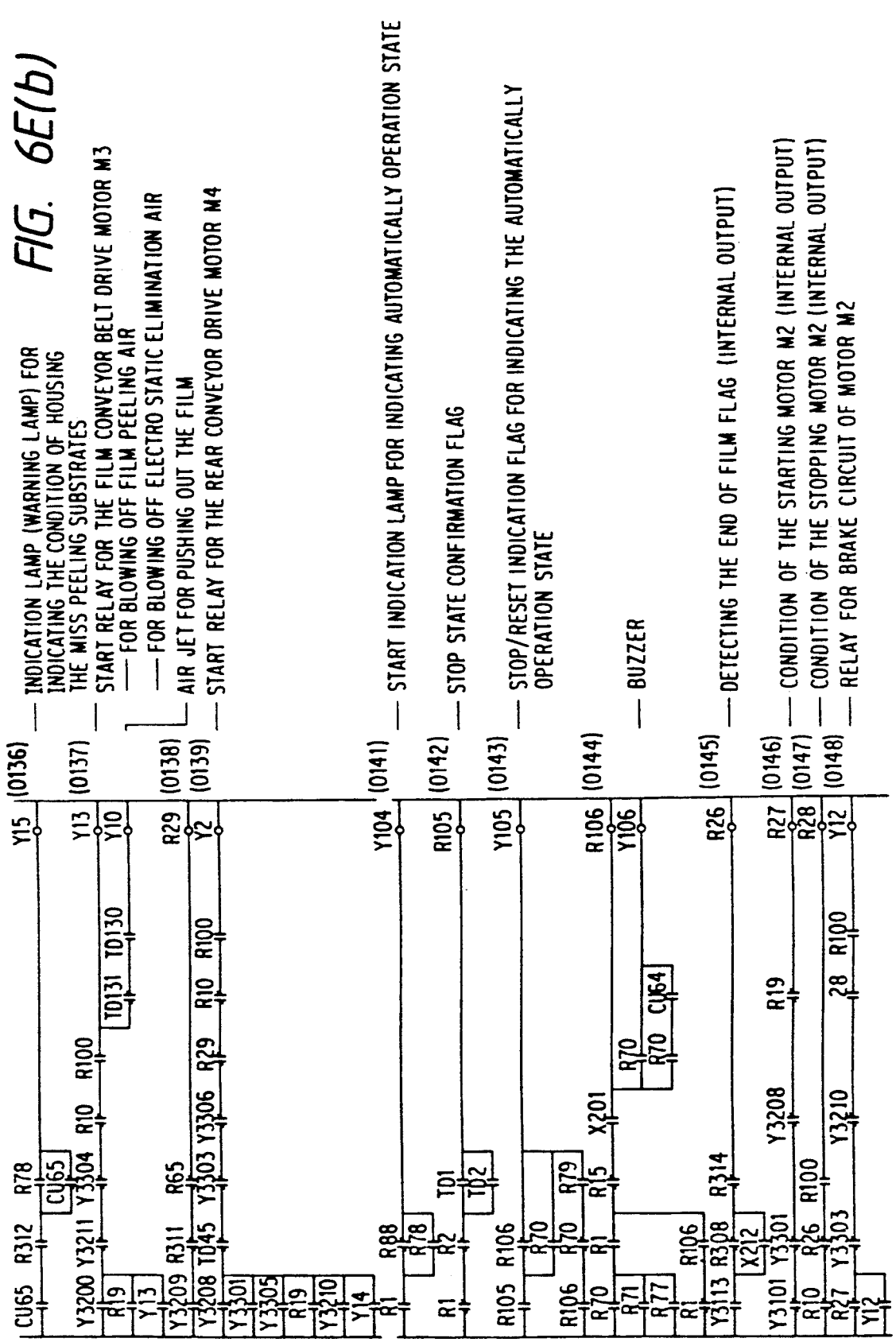

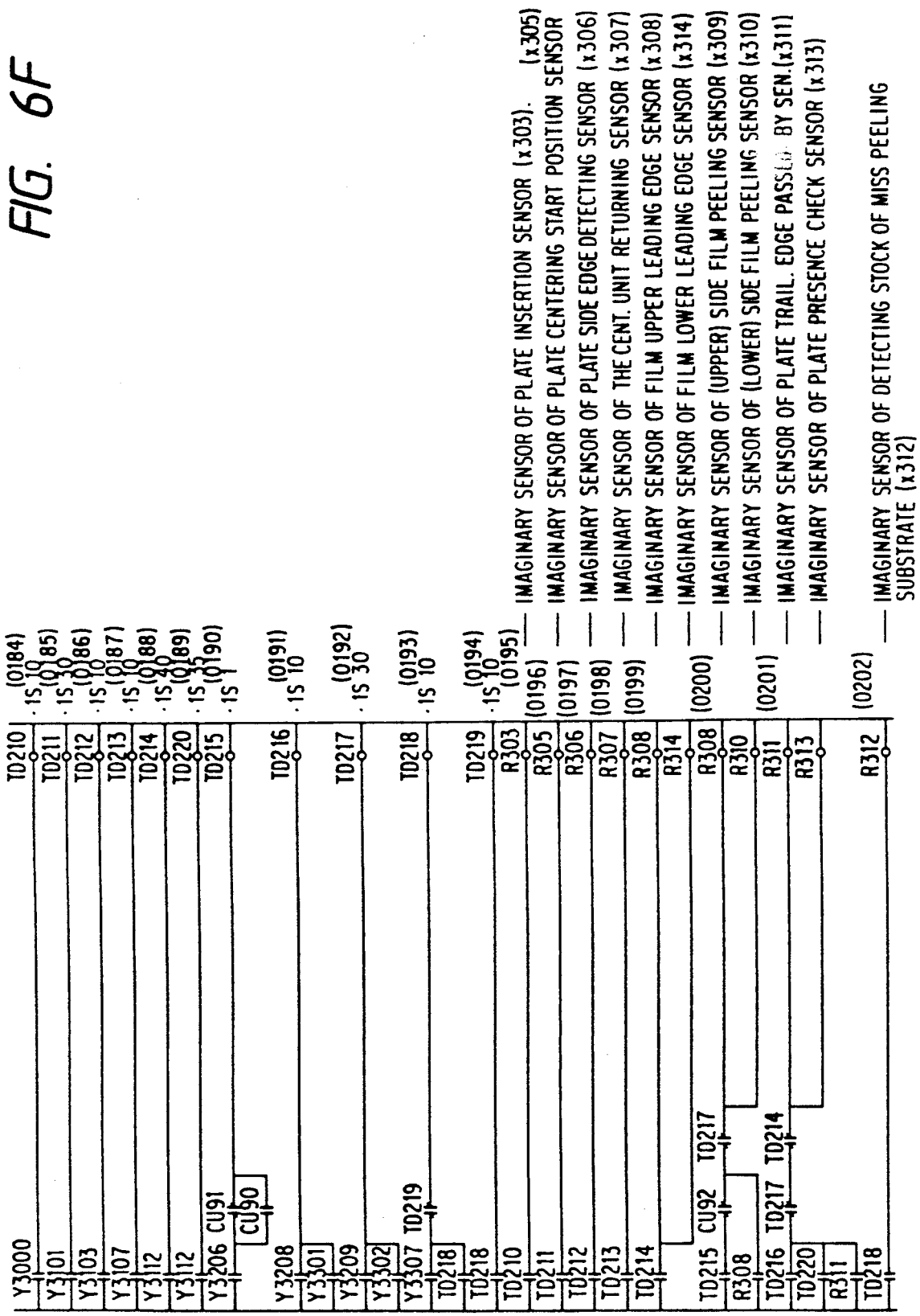

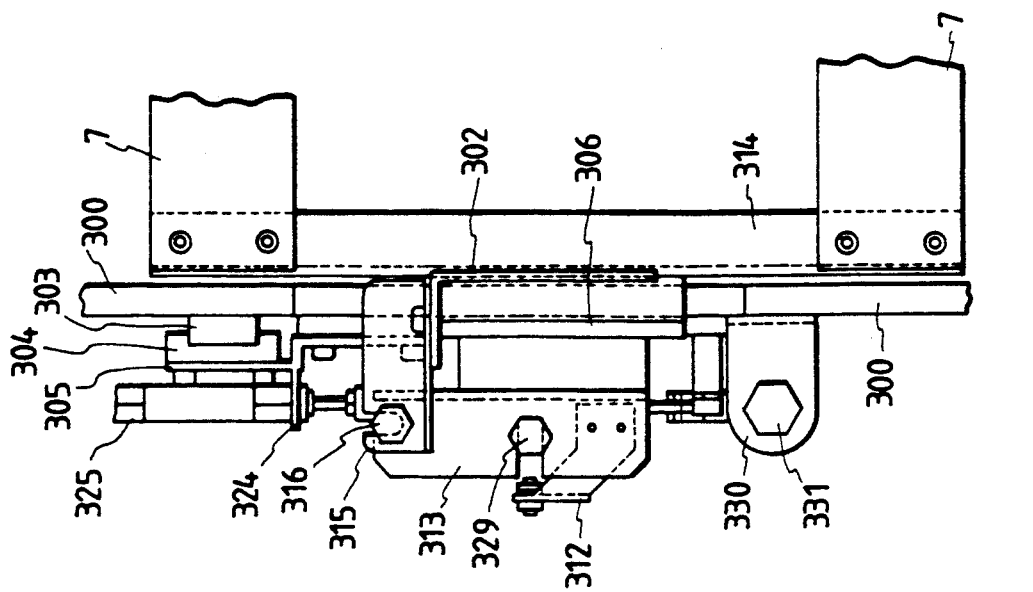
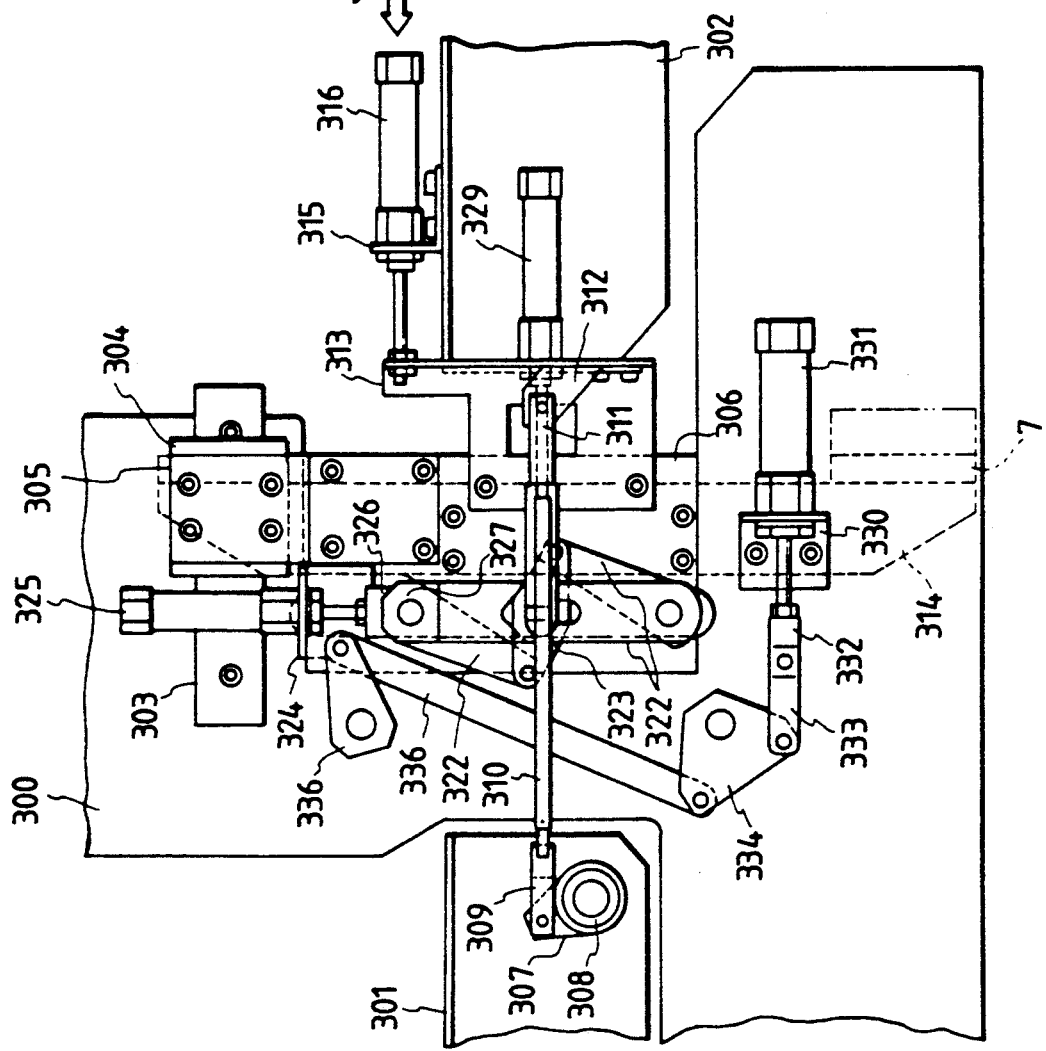

FILM PEELING METHOD AND APPARATUS FOR PRACTICING SAME

This is a continuation of U.S. patent application Ser. No. 07/622,981 filed Dec. 6, 1990 now abandoned.

BACKGROUND OF THE INVENTION

The present invention relates to an art in which a film stuck to a plate is peeled therefrom and discharged.

In a printed circuit board for an electronic machine such as a computer, wirings of copper or the like are provided in a prescribed pattern on one or both sides of an electrically insulating plate. The printed circuit board is manufactured as described from now on. A stratified body consisting of a photosensitive resin layer, which is a photoresist layer, and a cover film, which is made of a light-transmissible resin and protects the photosensitive resin layer, is first stuck, under heat and pressure, to an electroconductive layer provided on the plate. A wiring pattern film is then overlaid on the stratified body. The photosensitive resin layer is thereafter exposed to light through the wiring pattern film and the cover film for a prescribed time. After the wiring pattern film and the cover film are removed, the exposed photosensitive resin layer is developed so that an etching mask pattern is formed. The unnecessary portions of the electroconductive layer are thereafter removed by etching. The remaining portions of the photosensitive resin layer are then removed. The printed circuit board having the wirings in the prescribed pattern is thus manufactured.

An automatic film peeling apparatus, which is a machine for automatically peeling such a film from such a layer, was developed as disclosed in the Japanese Patent Application (OPI) No. 271356/89 (the term "OPI" as used herein means an "unexamined published application") corresponding to U.S. Pat. No. 5,000,861, issued Mar. 19, 1991. The apparatus peels a part of the film stuck to a plate, peels the other parts of the film starting with the border of the latter part on the former, and then discharges the peeled film. The apparatus includes a first film conveyance means by which the film having the former part peeled from the plate is conveyed upward over the surface of the plate while the film is pinched by a belt conveyor so that the film is peeled from the plate, and a second film conveyance means by which air is blown to the film conveyed by the first film conveyance means, so that the film is conveyed to a peeled film container.

As for the automatic film peeling apparatus mentioned above, the plate is temporarily stopped when the tightness of the contact between the former part of the film and the plate is reduced or the part is peeled from the plate. For that reason, the efficiency of the peeling of the film from the plate is low. This is a problem.

SUMMARY OF THE INVENTION

The present invention was made in order to solve the above-mentioned problem.

Accordingly, it is the first object of the present invention to provide an art in which the tightness of the contact of films with a base plate is reduced at the leading edges of the films without stopping the conveyance of the base plate while peeling them from the base plate, to enhance the efficiency of the peeling of the film.

It is the second object of the present invention to provide an art in which the first object is attained through relatively simple constitution.

It is the third object of the present invention to provide an art in which films stuck to a base plate are rapidly peeled therefrom, conveyed and discharged without changing the speed of the conveyance of the base plate.

The above-mentioned and other objects of the present invention as well as the novel features thereof will be apparent from the description herein and the drawings attached hereto.

In a method provided in accordance with the present invention to attain the first object, the films stuck to the base plate are peeled therefrom. The method has a major feature that the base plate stuck with the films is conveyed to a position wherein the films are peeled at the leading edges thereof from the base plate; the tightness of the contact of the films with the base plate is reduced or loosened at the leading edge of the films while the difference between the speed of the conveyance of the base plate and that of the movement of a film contact tightness reduction means is decreased and the conveyance of the base plate is not stopped; and a fluid is blown into the gaps between the base plate and the tightness-reduced films at the leading edges thereof to discharge the films while peeling the tightness-reduced films from the base plate.

In the method, the base plates stuck with the films is conveyed to the position wherein the films are peeled at the leading edges thereof from the base plate. In the method, the tightness of the contact of the films with the base plate is reduced at the leading edges of the films without stopping the conveyance of the base plate. In the method, the fluid is blown into the gaps between the base plate and the tightness-reduced films at the leading edges thereof to discharge the films while peeling the tightness-reduced films from the base plate. As a result, the efficiency of the peeling of the films is enhanced.

If the conveyance of the baseplate is temporarily stopped in a prescribed position on a base plate conveyance means so that the obliqueness of the base plate is corrected and the base plate is centered before the tightness of the contact of the films with the base plate is reduced at the leading edges thereof, the base plate is accurately positioned so that the tightness of the contact of the films with the base plate can be smoothly reduced at the leading edge of the films.

If the speed of the conveyance of the base plate is decreased when the base plate is conveyed to a prescribed position upstream of the position wherein the films are peeled from the base plate at the leading edges of the films and the tightness of the contact of the films with the base plate is reduced at the leading edges of the films, the reduction can be smoothly performed through a relatively simple constitution. The second object can thus be attained.

If the decreased speed of the conveyance of the base plate is altered back to the original level in discharging the films while peeling them, the base plate is rapidly conveyed at the time of the discharge of the films so as to enhance the efficiency of the peeling of the films.

If the arrival of the leading edges of the films at the prescribed position wherein the tightness of the contact of the films with the base plate is reduced at the leading edges thereof is detected so that a means for blowing the fluid is set in such a position to be obliquely oriented to the leading edges of the films and fluid guide plates are set in positions near the base plate, the films are smoothly peeled by blowing the fluid thereto.

Furthermore, if a height of the fluid guide plate from the base plate top surface is maintained in a prescribed range in response to a height of an upper roller, it is possible to raise the film by the blowing of the fluid flow without fail irrespective of a thickness of the base plate.

If the cone-shaped tip portions of film scratchers are vibrated in the axial directions thereof in contact with the surface of the film while extending downward obliquely to the direction of the conveyance of the base plate, to impart vibratory energy to the film to reduce the tightness of the contact thereof with the base plate at the leading edge of the film, the reduction is surely performed without stopping the conveyance of the base plate.

If the film scratchers are moved by a prescribed length in the direction of the conveyance of the base plate relative thereto while being in contact with the surface of the film, the reduction is more surely performed.

If the base plate is forcibly conveyed in reducing the tightness of the contact of the films with the base plate at the leading edges of the films, the base plate can be surely conveyed without stopping the conveyance thereof, regardless of the operative forces of the film scratchers and so forth.

In particular, if by using a gear having a large module ratio the upper pinch roller is forcibly rotated by the lower roller, it is possible to positively feed the base plate regardless of a change of the thickness of the base plate.

If fluid blowoff nozzle units which have fluid ejection holes oriented to the film scratcher contact portions of the gaps between the base plate and the films and have fluid ejection holes oriented to the leading edges of the films near the film scratcher contact portions are provided so that the nozzle units are preferably located between the conveyance passage for the base plate and the film scratchers near the scratchers, the films can be surely peeled from the base plate by blowing the fluid to the films.

If the leading edge portions of the films, which are peeled from the base plate by blowing the fluid to the films, are caused to cling to the fluid guide plates by the pressure of the fluid, the peeling of the films and the introduction of them into discharge passages through the blowing of the fluid can be smoothly performed.

If operation for reducing the tightness of the contact of the films with the base plate at the leading edges of the films is stopped through detecting that the peeled leading edge portions of the films have clung to the fluid guide plates, the operation can be precisely terminated.

If blowing the fluid to the tightness-reduced portions of the films to peel them from the base plate is stopped when the films have arrived from the stage of the blowing of the fluid to the films at the stage of the discharge of the films along with the peeling thereof, the blowing of the fluid can be precisely terminated.

If the tightness-reduced films are pinched by film catch belts so as to be discharged while being peeled, the films can be rapidly peeled.

If peeled film guides shaped as rods and made of an electroconductive substance and/or an ion generator is used, static electricity can be eliminated from the films in discharge passages for the peeled films to smoothly discharge the films.

If the films peeled from both the side of the base plate are discharged into a common film container, it is easy to accommodate the peeled films.

If the steps of the method are subjected to sequential control through the use of the relays and timers of a programmable logic sequential controller, the steps can be automatically controlled.

A film peeling apparatus provided in accordance with the present invention to attain the second object is characterized by including a base plate conveyance means for conveying the base plate stuck with the films; a base plate centering start position sensor for detecting that the base plate is conveyed forward on the conveyance means and reaches a prescribed position upstream of the position of peeling of the films from the base plate; a base plate centering unit which is put into action on the base of the output from the centering start position sensor so as to move the center of the width of the base plate to the center line of the conveyance means; a base plate slowing means for decreasing the speed of the conveyance of the base plate at the end of the action of the centering unit; film edge sensors for detecting the leading edges of the films stuck to the base plate; a film contact tightness reduction means which is put into action on the basis of the outputs from the film edge sensors so as to reduce the tightness of the contact of the films with the base plate at the leading edges of the films without stopping the conveyance of the base plate; a fluid blowing means for blowing the fluid into the gaps between the base plate and the leading edges of the films reduced in the tightness of the contact thereof with the base plate by the tightness reduction means, to separate the films from the base plate; film peeling sensors for detecting that the separated films have entered into film discharge passages; a means for altering the decreased speed of the conveyance of the base plate back to the original level thereof on the basis of the outputs from the film peeling sensors; and a film pinch means for discharging the films while pinching the separated films and peeling them from the base plate.

In the film peeling apparatus, the base plate conveyance means, the base plate centering start position sensor, the base plate centering unit, the base plate slowing means, the film edge sensors, the film contact tightness reduction means, the fluid blowing means, the film peeling sensors and the film pinch means are provided so that the base plate stuck with the films is conveyed to the position of the peeling of the leading edge portions for the films, the tightness of the contact of the films with the base plate is reduced at the leading edges of the films without stopping the conveyance of the base plate, and the films are discharged while being peeled after the reduction in the tightness of the contact. For that reason, the films can be automatically and efficiently peeled from the base plate.

If a base plate insertion sensor for detecting the insertion of the base plate into the inlet portion of the base plate conveyance means in order to start the conveyance of the base plate is provided in the film peeling apparatus, the conveyance can be automatically started.

If a base plate passing sensor for detecting the complete passing of the trailing edge of the base plate through the film peeling position in order to stop the conveyance of the base plate and the films is provided in the apparatus, the conveyance can be automatically stopped.

If guide members and guide rollers are provided in the apparatus so as to guide the base plate to prevent it from sagging, even if the thickness of the base plate is small, the films can be smoothly peeled from the base plate regardless of the thickness thereof.

If peeled film guide members for guiding the peeled films having passed through the film pinch means made of film catch belts, for example, and fluid ducts for discharging the films guided by the guide members are provided in the apparatus, the peeled films can be smoothly discharged.

If a return sensor for detecting the termination of the action of the base plate centering unit is provided in the apparatus and is a magnetic sensor which reacts to the position of an actuator for driving the centering unit, the termination can be detected without contact with the centering unit.

If the film edge sensors are of electrostatic capacity reaction type, the edges of the films can be precisely detected in terms of the difference in electrostatic capacity.

In a method provided in accordance with the present invention to attain the third object, the films stuck to the base plate are peeled therefrom. The method has a major feature that the base plate stuck with the films is conveyed to a position wherein the films are peeled from the base plate at the leading edges of the films; the tightness of the contact of the films with the base plate is reduced at the leading edges of the films while a film contact tightness reduction mechanism is moved, for a prescribed time, at a speed synchronized with that of the conveyance of the base plate and the speed of the conveyance is substantially unchanged; and a fluid is blown into the gaps between the base plate and the tightness-reduced films at the leading edges thereof to discharge the films while peeling the tightness-reduced films.

In the method, the base plate stuck with the films is conveyed to the position of the peeling of the films at the leading edges thereof, the tightness of the contact of the films with the base plate is reduced at the leading edges of the films while the film contact tightness reduction mechanism is moved at the speed synchronized with that of the conveyance of the base plate and the speed of the conveyance is substantially unchanged, and the fluid is blown into the gaps between the base plate and the tightness-reduced films at the leading edges thereof to discharge the films while peeling the tightness-reduced films. For that reason, the efficiency of the peeling of the films can be more enhanced.

A film peeling apparatus provided in accordance with the present invention to attain the third object includes a base plate conveyance means having conveyance rollers; a base plate centering start position sensor; a base plate centering unit; a base plate leading edge sensor; a film contact tightness reduction means; a fluid blowing means; a support frame fitted with the tightness reduction means and the fluid blowing means and movable in the direction of the conveyance of the base plate; a means for moving the support frame synchronously with the rotation of the conveyance rollers for a prescribed time so that the speed of the conveyance of the base plate is substantially unchanged during the reduction in the tightness of the contact of the films with the base plate; film peeling sensors; a film discharge means; and a sequential control means which operates on the basis of the output signals from the sensors. The base plate is conveyed to the position wherein the films are peeled from the base plate at the leading edges of the films. The tightness of the contact of the films with the base plate is reduced at the leading edges of the films while the support frame is moved at a speed synchoronized with that of the conveyance of the base plate and the speed of the conveyance is substantially unchanged. A fluid is blown in between the base plate and the leading edges of the tightness-reduced films to discharge the films while peeling the tightness-reduced films. As a result, the efficiency of the peeling of the films can be more enhanced.

If the base plate conveyance means has a base plate push conveyance roller and is provided with a mechanism which drives the roller on the bases of the output signal from the base plate leading edge sensor so as to push the base plate and stops the pushing thereof after a prescribed time, the base plate can be surely and synchronously conveyed even during the reduction of the tightness of the contact of the films with the base plate.

If the means for moving the support frame has a crank mechanism which is driven synchronously with the rotation of the base plate conveyance rollers, the support frame can be easily moved in the direction for the conveyance of the base plate.

If the crank mechanism includes crank members coupled at one end of each thereof to the support frame and includes an one-way clutch means for synchronizing the movement of the crank members and the rotation of the base plate conveyance rollers with each other only while the tightness of the contact of the films with the base plate is reduced at the leading edges of the films, the movement of the support frame does not interfere with the rotation of the conveyance rollers.

If the base plate leading edge sensor is provided near the film edge sensors, the base plate can be surely detected even if the films are stuck to the entire surfaces of the base plate.

BRIEF DESCRIPTION OF THE DRAWINGS

The exact nature of this invention as well as other objects and advantages thereof will be apparent from consideration of the following specification relating to the accompanying drawings, in which like reference characters designate the same or similar parts throughout the figures thereof and wherein:

FIG. 3C is a perspective view of the tightness reduction mechanism;

FIGS. 6A, 6B, 6C, 6D, 6E and 6F are diagrams of programs for the programmable controller of the first embodiment;

FIG. 8A is a side view of a portion for supporting a film contact tightness reduction mechanism which is a feature of a second embodiment of the present invention and operates at a speed synchronized with that of the conveyance of a base plate;

FIG. 8B is a view of the portion seen along an arrow Y shown in FIG. 8A;

DESCRIPTION OF THE PREFERRED EMBODIMENTS

Figure 1:
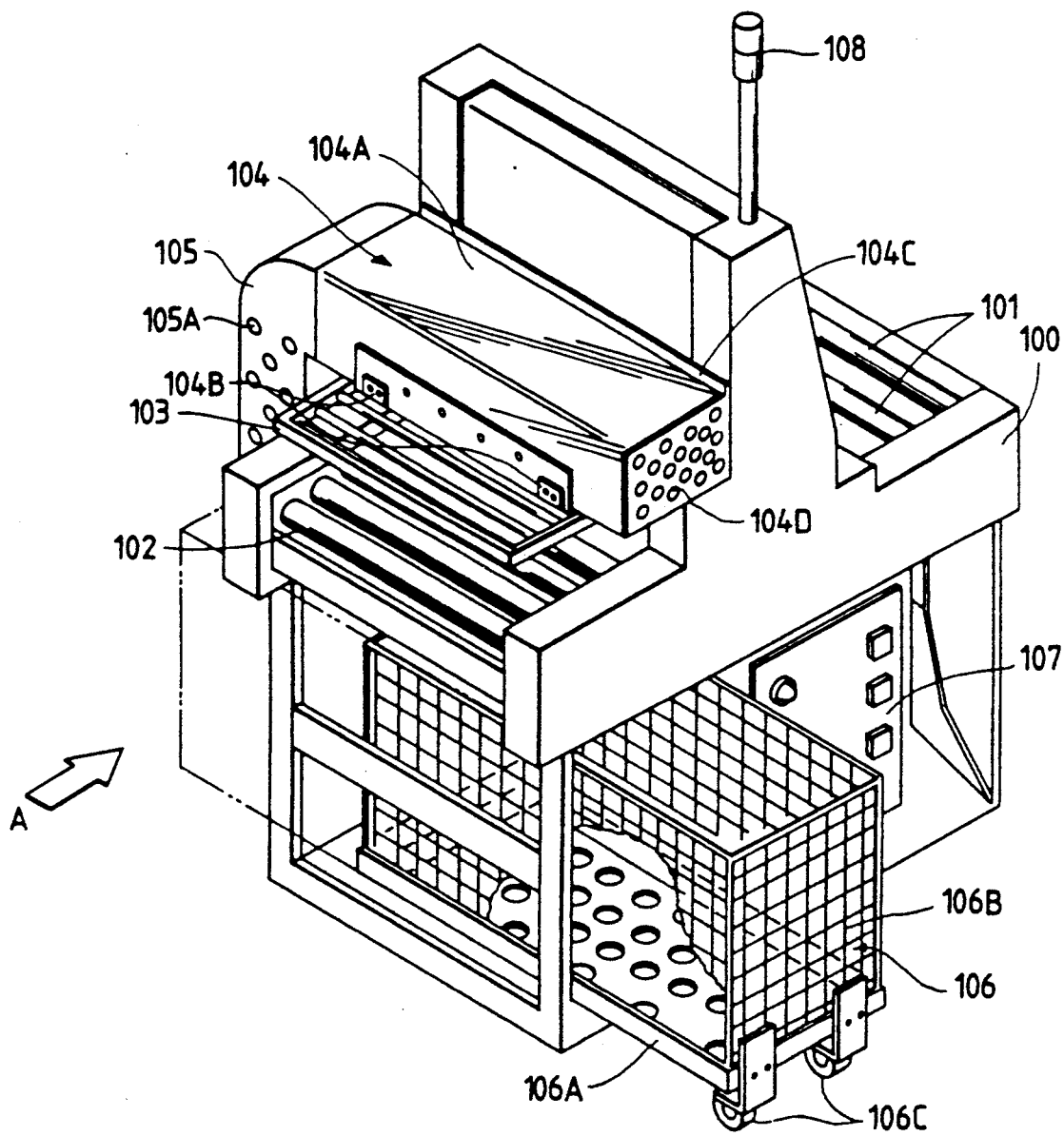
FIG. 1 is a perspective schematic view of a film peeling apparatus which is a first embodiment of the present invention and peels films from a base plate for a printed circuit board.

Embodiments of the present invention are hereafter described in detail with reference to the drawings attached hereto. The embodiments are applied to a method of peeling a protective cover film from a base plate for a printed circuit and an apparatus for practicing the method. Equivalents shown in the drawings are denoted by the same reference symbols and not repeatedly described in detail, hereinafter.

Figure 2A:
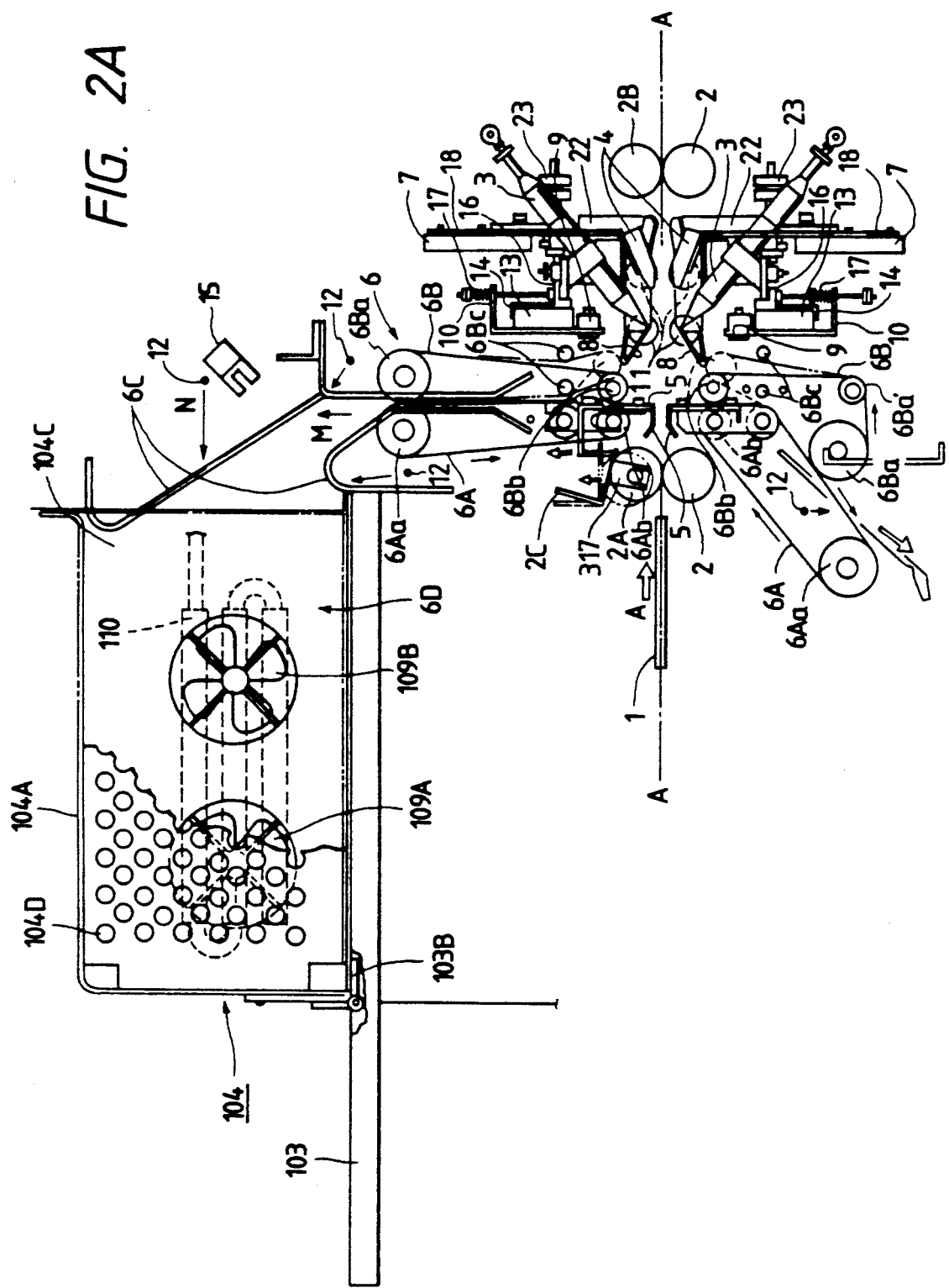
FIG. 2A is a view showing the detail of the film peeling mechanism in the vicinity of the pneumatic film conveyance box shown in FIG. 1.

FIG. 1 is a perspective schematic view of the apparatus according to a first embodiment by which the protective cover film is peeled from the base plate. FIG. 2A is a detailed view of the pneumatic film conveyance box of the apparatus and the vicinity of the box.

The base plate conveyance mechanism of the apparatus includes plate conveyance roller units 102 and 101 attached to the body 100 of the apparatus in the plate advancing direction A as shown in FIG. 1. An air duct rest 103 is provided over the plate conveyance roller unit 102. One end of the air duct rest 103 is fixed to the body 100. An air duct 104 made of a transparent material is provided on the air duct rest 103. The left side (as viewed in the plate advancing direction A) of the air duct 104 is connected to a top opening of a peeled film discharge duct 105 having a large number of air pressure reduction holes 105A on the side thereof. Air passage holes 104D are provided in the right side of the air duct 104. The top and front side of the air duct 104 are integrated with each other to constitute a part of a cover 104A attached to the body 104C of the duct by hinges 104B so that the cover can be opened and closed.

As shown in FIG. 2A, in a right side of the interior of the air duct 104, there are disposed an ion-generator (i.e., static electricity remover) 110 for removing static electricity from the peeled film, blower fans 109A and 109B and a film discharge air nozzle (not shown).

The outlet of the peeled film discharge duct 105 is located over a peeled film container 106, which receives the peeled film. The container 106 includes a base 106A having a large number of air pressure reduction holes, a netted portion 106B, and casters 106C.

A control panel 107 is provided on a side of the body 100 of the apparatus. A warning lamp 108 is provided on the top of the apparatus body 100.

As shown in FIG. 2A, the film buoy-up members 3 of a film buoy-up unit such as a pneumatic vibrator type film scratcher, the fluid blowoff nozzle members 4 of a fluid blowing unit, air guide plates 5, which serve as peeling assistant plates, and a film conveyor 6, which serves as a film discharger, are provided along a base plate conveyance passage A-A on the base plate conveyance mechanism.

The base plate 1 for the printed circuit is made of an electric insulator coated with an electroconductive layer of copper or the like on one or both sides of the base plate. A stratified body consisting of a photosensitive resin layer, which is a photoresist layer, and the cover film, which is a protective film, is stuck, under heat and pressure, to the electroconductive layer of the plate 1 in advance. The plate 1 is brought to the film peeling apparatus after the photosensitive resin layer is exposed to light through a prescribed wiring pattern film overlaid on the stratified body. The plate 1 is conveyed by the drive rollers 2 of the plate conveyance roller units 101 and 102 in a direction A shown in FIG. 2A.

A base plate push conveyance roller 2A, which is a pinch roller, is provided so that a base plate 1 for a printed circuit board is prevented from being displaced out of centered state when the base plate passes on the roller and cover films are peeled from the base plate.

Figure 2B:
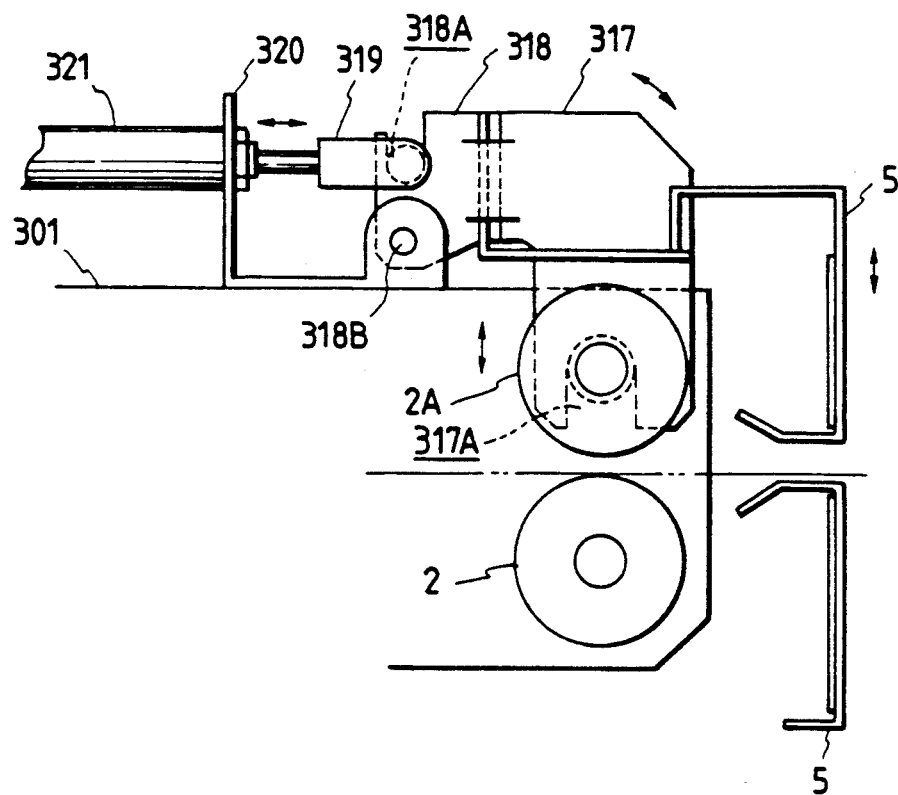
FIG. 2B is a partially enlarged view showing the vicinity of the upper pinch roller on an enlarged scale shown in FIG. 2A.

As shown in more detail in FIG. 2B, the upper pinch roller 2A is depressed against the plate surface from above by a roller push plate 317 so that the plate may be positively fed by the rotation of the upper roller 2A. A roller push portion 317A of the roller push plate 317 has an inverted U-shape so as to permit the upper roller 2A movable downwardly. A lever 318 carries the roller push plate 317. The lever 318 has a U-shaped connection member receiving portion 318A which in turn engages a coupling member 319 fixed to a tip end of a rod of the push roller elevating/lowering pneumatic cylinder 321.

Therefore, when the rod of the pneumatic cylinder 321 is extended or retracted, the roller push plate support lever 318 is rotated about a pivot 318B, to thereby move the roller push plate 317 up and down. Since the air guide plate 5 is provided on the roller push plate 317, the vertical position of the air guide plate 5 is also changed in response to the vertical position change of the upper roller 2A (i.e., the roller push plate 317) in correspondence with the change of the thickness of the base plate 1. Accordingly, even if the thickness of the base plate 1 is changed, it is possible to automatically keep in a predetermined range (0.5–1.5 mm for example), suitable for keeping air flow and raising the film, a distance between the air guide plate 5 and the base plate top surface. It should be noted that the vertical position of the air guide plate 5 is manually adjustable in response to the thickness of the base plate 1.

Figure 2C:
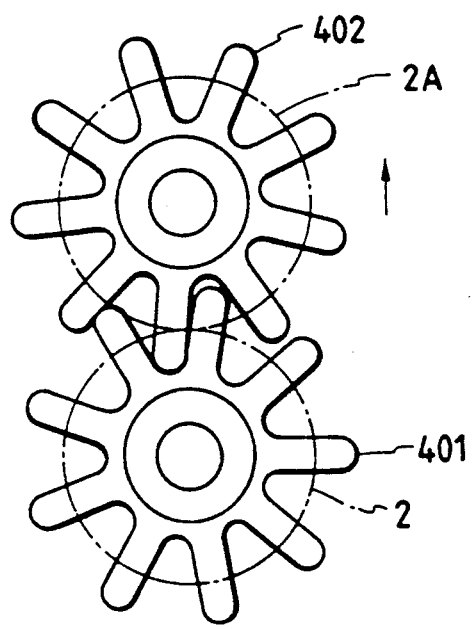
FIG. 2C is a view showing the gear for driving the upper pinch roller shown in FIG. 2A.

As shown in more detail in FIG. 2C, the above-mentioned upper pinch roller 2A is forcibly driven by a pair of gears 401 and 402 which are fixed to the ends, on the same side, of the lower drive roller 2 and the upper pinch roller 2A and engaged with each other with a large module ratio. The reason why the large module ratio gears are used is that, when the thickness of the base plate 1 is changed, the space between the pinch roller 2A and the drive roller 2 is also changed. In this manner, if the gears having the large module ratio, i.e., long teeth are used, even if the space between the engaged teeth is enlarged, since the engagement allowance is large, it is possible to respond to the change of the gear tooth space due to the change in thickness of the base plate. It is thus possible to ensure the operation of the pinch roller 2A. In the embodiment, when the rollers 2 and 2A are brought into contact with each other, pitch circles of the two gears coincide with each other so that it is possible to respond to the change in thickness of the base plate in the range of 0 to 4 mm.

As described above, even during the scratch operation, by forcibly drivingly rotating the upper pinch roller 2A in synchronism with the lower drive roller 2, the base plate is positively delivered. Thus, the scratcher and the base plate may be moved relative to each other. Accordingly, it is possible to avoid a fear that the base plate would be drawn by the scratcher during the scratch operation. It is possible to loosen the film smoothly and positively.

Figure 3A:
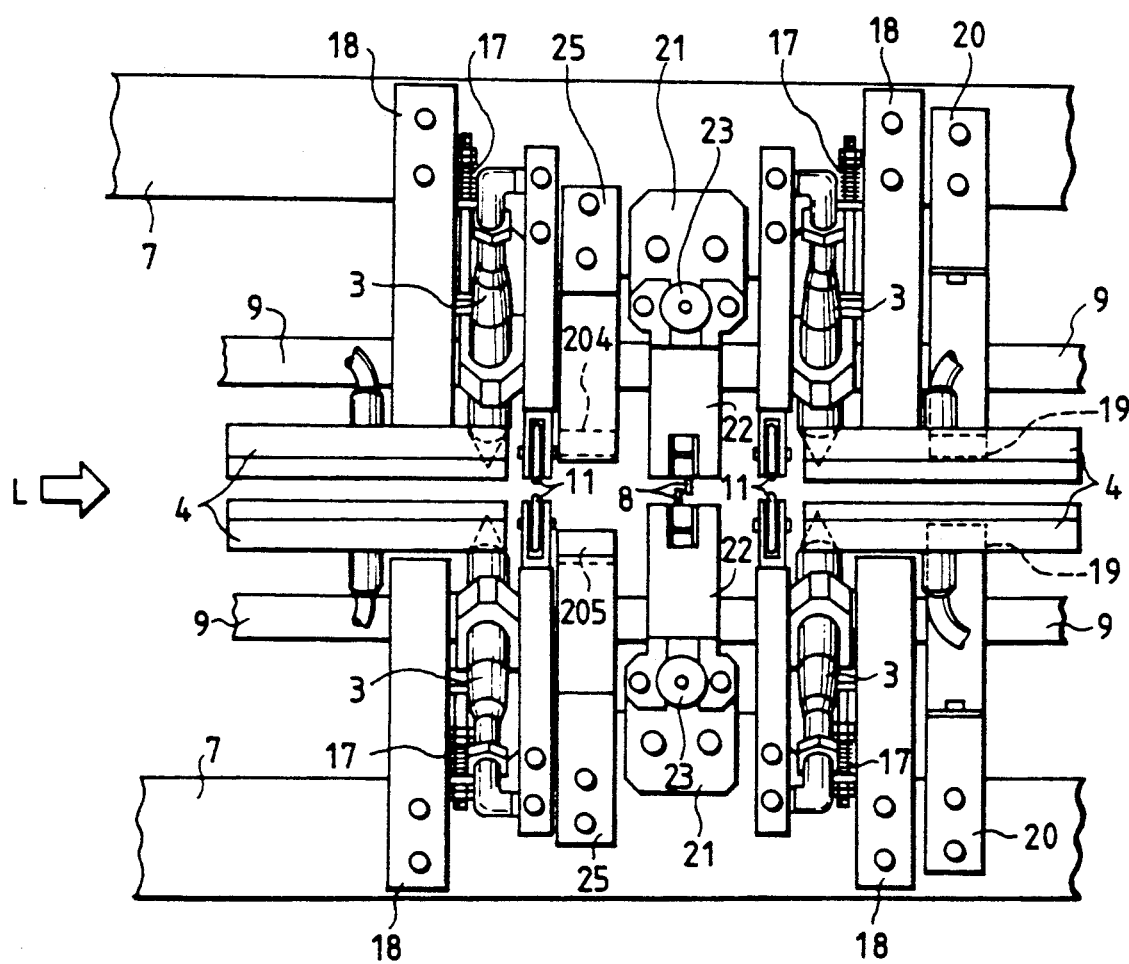
FIG. 3A is a view of a film contact tightness reduction mechanism seen oppositely to the direction of the conveyance of the base plate.
Figure 3B:
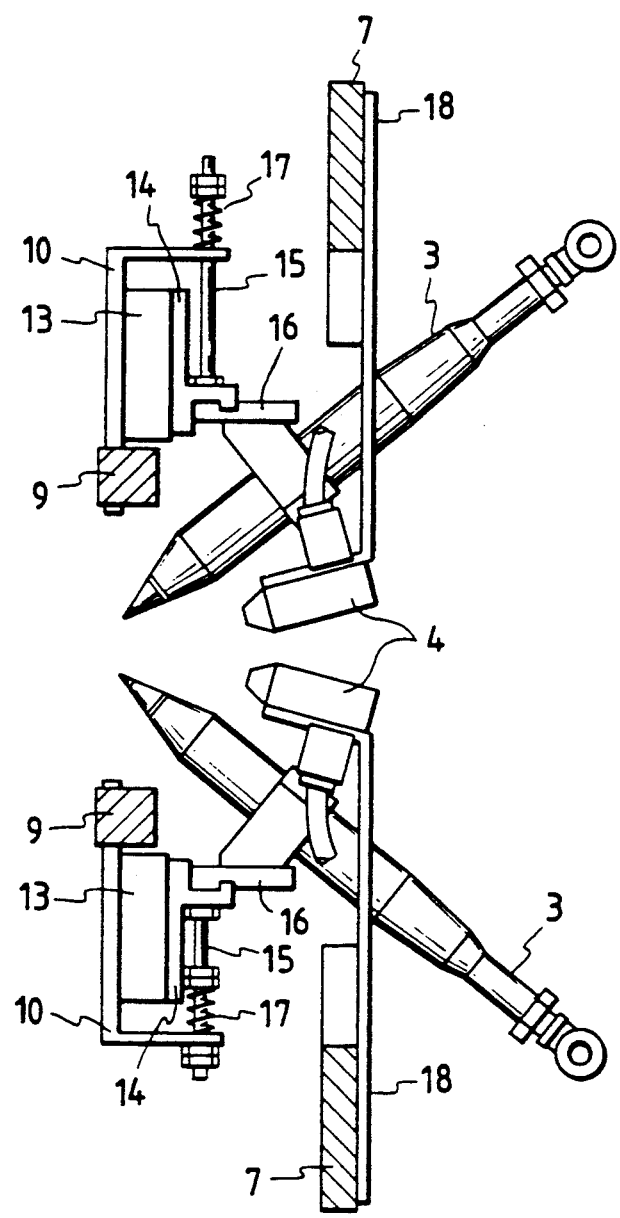
FIG. 3B is a side view of the tightness reduction mechanism seen along an arrow L shown in FIG. 3A.
Figure 3D:
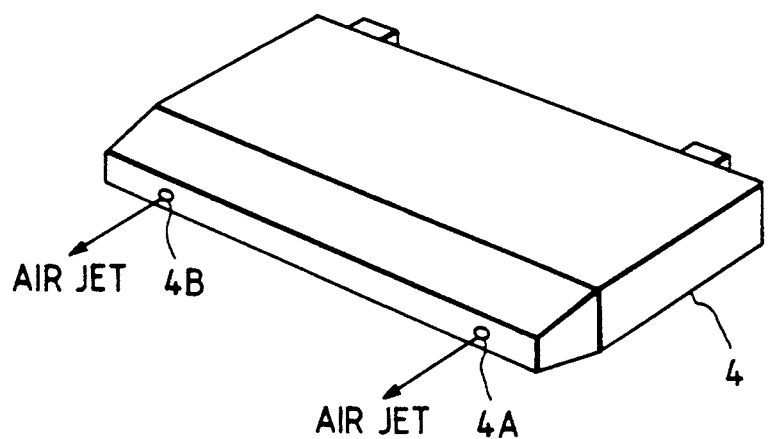
FIG. 3D is a perspective view of a fluid blower.

FIG. 3A is a view of a film contact tightness reduction mechanism seen oppositely to the direction of the conveyance of the base plate 1. FIG. 3B is a side view of the mechanism seen along an arrow L shown in FIG. 3A. FIG. 3C is a perspective view of the mechanism. FIG. 3D is a perspective view of a film edge detection mechanism.

In a film buoy-up unit, at least one support member 10 for a film buoy-up member 3 is secured to each of buoy-up member support rotary shafts 9 provided over and under a base plate conveyance plane, as shown in FIGS. 2A, 3A, 3B and 3C. A sliding block 13 is attached to the support member 10, and fitted on a guide rail 14 so that the block can be moved up and down. A buoy-up member support block 16 is secured to the guide rail 14. The film buoy-up member 3 is attached to the buoy-up member support block 16, and extends obliquely to the base plate conveyance plane. The upper portion of the support member 10 for the film buoy-up member 3 has a through hole through which a long screw 15 slightly smaller in diameter than the hole extends. A spring 17 is provided on the long screw 15 at one end thereof. The screw 15 is secured at the other end thereof to the buoy-up member support block 16.

The tip portion of the film buoy-up member 3 is conically shaped, and can be vibrated by a pneumatic vibrator which causes the vibration of 2,000 to 3,000 strokes per minute, for example. The tip portion of the buoy-up member 3 is constituted to vibrate and push the edge portion of a stratified film consisting of a photosensitive resin layer and the cover film, to impart energy to the edge portion of the stratified film to buoy up the cover film from the photosensitive resin layer at the edge portion. The reason why only the cover film of the edge portion to which the energy is imparted is buoyed up is presumed to be that the cover film is higher in extensibility than the photosensitive resin layer and the adhesive power between the resin layer and an electroconductive layer on the base plate is stronger than that between the resin layer and the cover film.

Figure 3E:
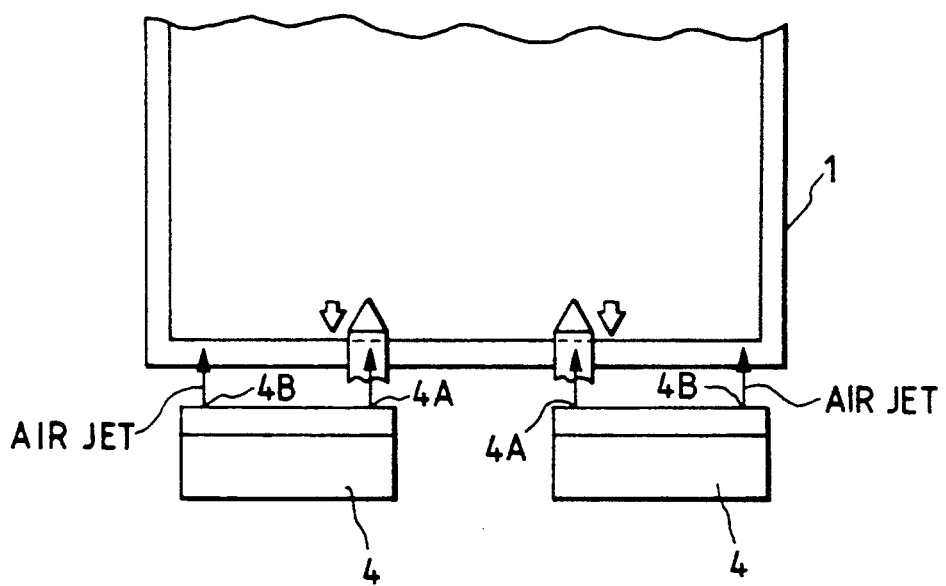
FIG. 3E is a plan view of FIG. 3D.

As shown in FIGS. 3B and 3C, a fluid blower is made of fluid blowoff nozzle units 4 attached to fluid blowoff nozzle unit attaching plates 18 at one end of each thereof. The plates 18 are secured to fixed support members 7 provided over and under the base plate conveyance plane. A pressurized fluid, which is a gas such as air and an inert gas or is a liquid such as water, is blown off from each of the nozzle units 4. In this embodiment, the fluid is air. The fluid blowoff nozzle unit 4 is located near tip of the film buoy-up member 3. The tip of the nozzle unit 4 is oriented to the leading edge of the stratified film stuck to the base plate, to directly blow the fluid into the gap between the photosensitive resin layer and the cover film buoyed up therefrom by the film buoy-up member 3. As shown in FIGS. 3D and 3E the tip portion of the nozzle unit 4 has a plurality of fluid ejection holes 4A, 4B, one (4A) of which is oriented to the tip of the film buoy-up member 3 or to the above-mentioned gap and the others (4B) of which are oriented to the edge of the film at the right and left of the tip of the buoy-up member near the tip. The reason why the plurality of fluid ejection holes are provided in the nozzle unit 4 is to surely peel the cover film by blowing the fluid thereto. The fluid is fed to the nozzle units 4 through a single fluid feed pipe.

Figure 3F:
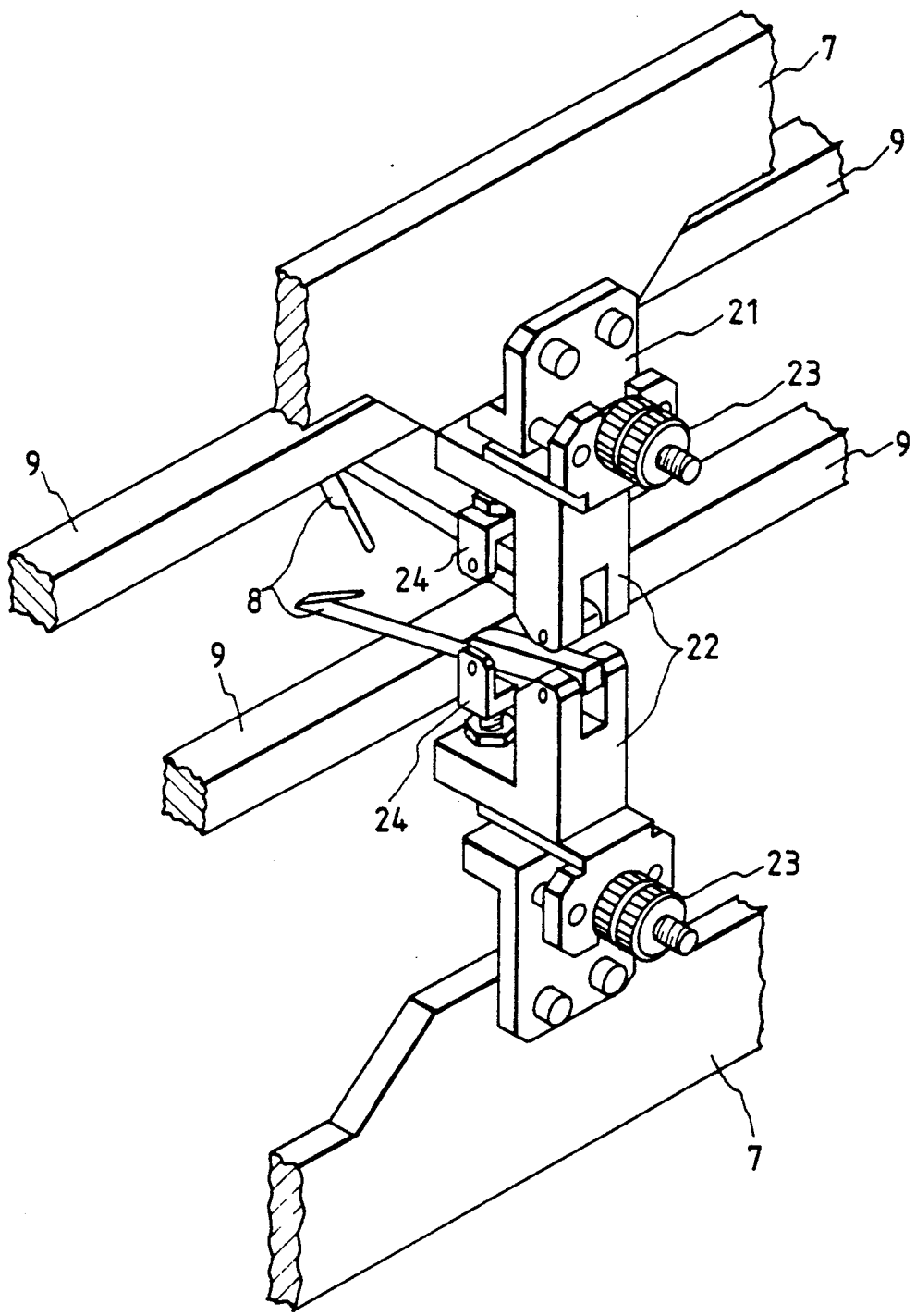
FIG. 3F is a perspective view of a film edge detection mechanism.

At the center of the film buoy-up unit, film edge detection member attaching blocks 22 are supported by fixed members 21 attached to the upper and the lower fixed support members 7, as shown in FIGS. 3A and 3F, so that the blocks can be moved backward and forward. The position of each of the blocks 22 can be shifted backward and forward by a film edge detection member position adjusting knob 23. A film edge sensor 8 is rotatably supported at one end thereof by the attaching block 22 at the tip thereof. A vertical movement member 24 for the film edge sensor 8 is rotatably supported by the attaching block 22 at the central portion thereof. One end of the vertical movement member 24 is secured to the attaching block 22 through a compact pneumatic cylinder.

Sensor securing members 25 are attached at one end of each thereof to the upper and the lower fixed support members 7 near the film edge sensor attaching blocks 22. A film peeling sensor 204 is secured to the sensor securing member 25 at the other end thereof over the base plate conveyance plane. Another film peeling sensor 205 is secured to the other sensor securing member 25 at the other end thereof under the base plate conveyance plane.

Buoying up the edge of the film on the base plate 1 and peeling the film at the edge are nearly the same in principle as those described in the Japanese Patent Application (OPI) No. 271356/89 (the term "OPI" as used herein means an "unexamined published application"), and are therefore not described in detail herein.

The cover film peeled from the photosensitive resin layer at the leading edge of the base plate by the air ejected from the air blowoff nozzle units 4 of the fluid blower is pushed onto the air guide plate 5 by the pressure of the air. Guide wheels 11 are provided to guide the base plate 1 to prevent it from sagging at the leading edge thereof, even if the thickness of the base plate is small. The reason why the guide wheels 11 are provided is that the film buoy-up members 3 and the air blowoff nozzle units 4 are provided in or at the film buoy-up unit in such a manner that conveyance rollers cannot be disposed at them. The guide wheels 11 are particularly effective for base plates of large width.

As shown in FIG. 2A, a film conveyor 6 includes an upper and a lower film conveyance units in the main. The upper film conveyance unit is provided over the conveyance passage A-A for the base plate 1. The lower film conveyance unit is provided under the base plate conveyance passage A-A. The upper film conveyance unit includes a first film conveyance section 6A and 6B, peeled film guide members 6C and a second film conveyance section 6D. The peeled film is conveyed by the first and the second film conveyance sections 6A, 6B and 6D while being guided by the peeled film guide member 6C in a direction shown by an arrow M in FIG. 2. The guide members 6C act to alter the direction of the conveyance of the peeled film in such a manner that the vertical direction of the conveyance of the peeled film is changed into a horizontal direction which is parallel with the base plate conveyance passage A-A but opposite to the direction of the conveyance of the base plate 1. The guide members 6C are made of rods so as to minimize contacting area with the speed film and disposed at an interval along a direction extending across the base plate conveyance passage A—A. For example, the guide members 6C are made of an electroconductive substance such as stainless steel wire so as to eliminate static electricity generated on the peeled film in the peeling or/and conveyance thereof. The peeled film guide members 6C act to prevent the peeled film from being involved by a roller 6Aa for a fixed conveyance belt 6A and/or a roller 6Bb for a movable conveyance belt 6B during the conveyance of the film from the first film conveyance section 6A and 6B to the second film conveyance section 6D.

A fluid ejector 12 and an ion generator 15, which is an electricity eliminator, are provided near the peeled film guide members 6C. The fluid ejector 12 ejects a fluid in a direction shown by an arrow N in FIG. 2A. The ion generator 15 acts to eliminate static electricity from the peeled film to prevent it from clinging to the guide members 6C due to the electricity when the film is conveyed from the first film conveyance section 6A and 6B to the second film conveyance section 6D.

Shown at 2C in FIG. 2A is a hung plate for moving the upper air guide plate 6 down toward the base plate 1 and up away therefrom. The hung plate 2C is coupled at both the ends thereof to pneumatic cylinders for moving the hung plate, and is also coupled at both the ends thereof to a holder 317 for holding the rotary shaft of the base plate push conveyance roller 2A.

FIG. 2A also shows the fixed support members 7, the film edge sensors 8, the film buoy-up member support rotary shafts 9 coupled at both the ends thereof to crank mechanisms, and rollers 6Ba', 6Ab, 6Bb and 6Bc.

The film catch belts 6A and 6B of the first film conveyance section are toothed rubber belts. The rollers Aa, 6Ab, 6Ba, 6Ba' and 6Bb are toothed pulleys for securely moving the belts 6A and 6B.

As shown in FIGS. 1 and 2A, the second film conveyance section 6D is provided on an air duct rest 103. The section 6D is made of an air duct 104 coupled to a cover film discharge duct 105. The top and one side of the air duct 104 is integrally formed to be a cover portion 104A attached to the body 104C of the duct by a hinge 104B so as to be openable and closable. The cover portion 104A has air passage holes 104D in prescribed positions. Blowing fans 109A and 109B for injection of ions are provided in the body 104C of the duct 104 and located so as to face the air passage holes 104D.

Figure 4:
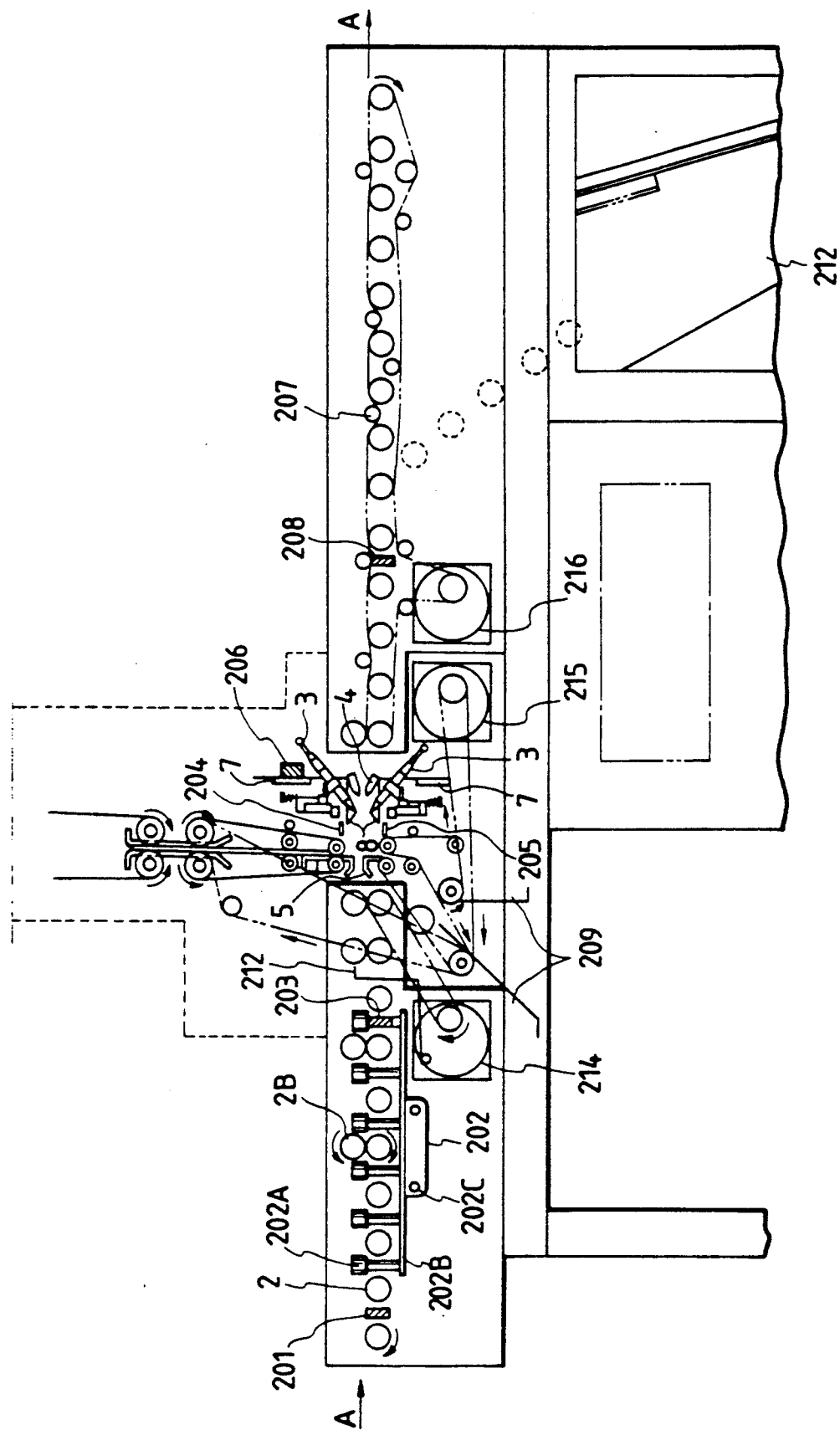
FIG. 4 is a schematic view for describing a film peeling method and the control means of the first embodiment.
Figure 5A:
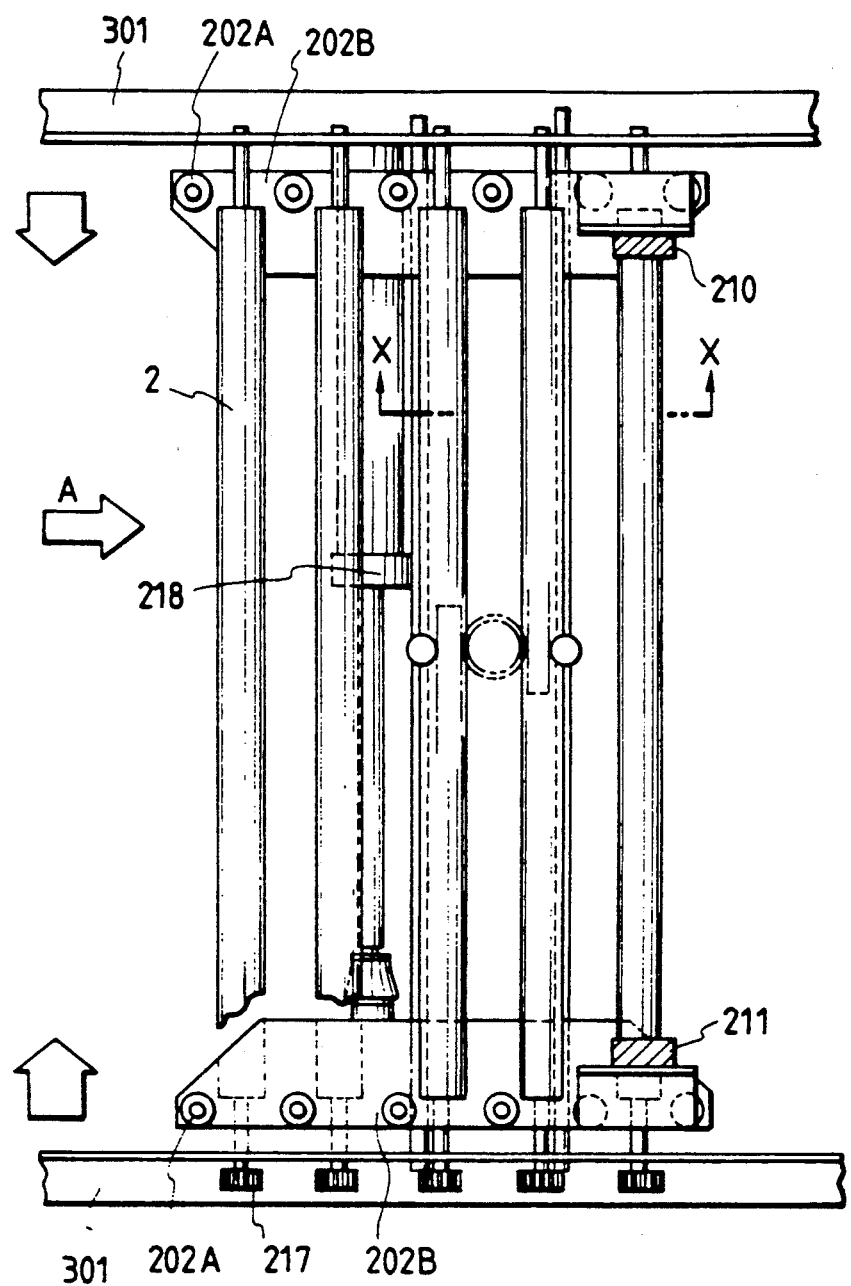
FIG. 5A is a view for describing the constitution of a base plate centering unit.
Figure 5B:
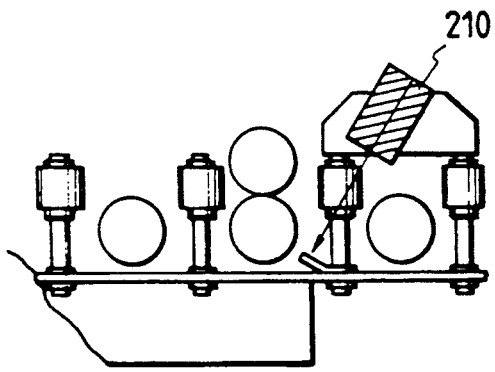
FIG. 5B is a sectional view of the centering unit along a line X—X shown in FIG. 5A.

FIG. 4 is a schematic view for describing a film peeling method of the first embodiment of the present invention. FIG. 4 is also for describing the control means of an apparatus for practicing the film peeling method. FIG. 5A shows the constitution of the base plate centering unit of the apparatus. FIG. 5B is a sectional view of the centering unit along a line X—X shown in FIG. 5A.

Figure 5C:
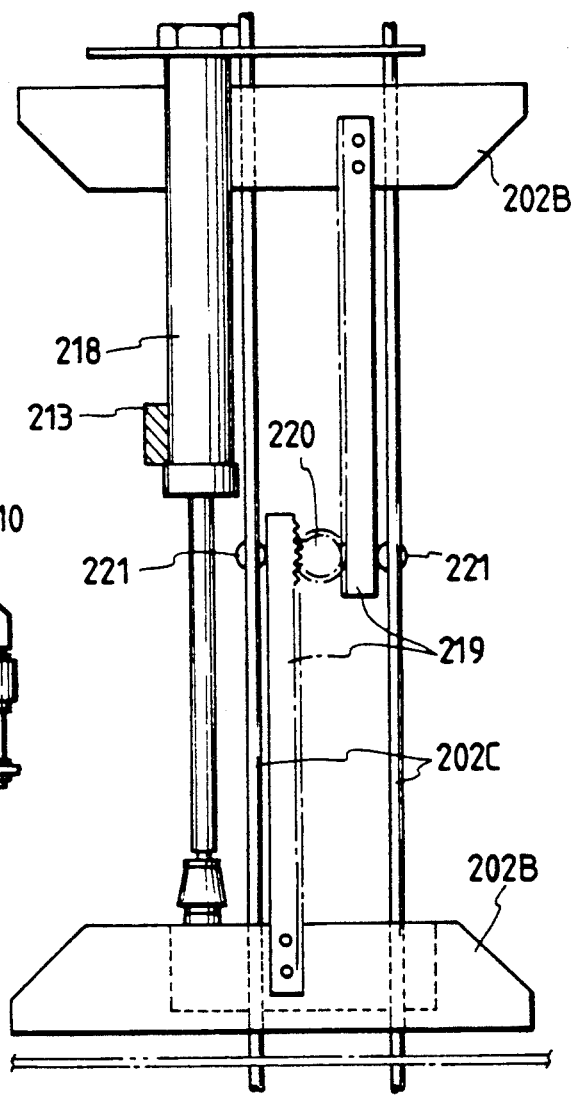
FIG. 5C is a view for describing the operating portion of the centering unit.
Figure 6A:
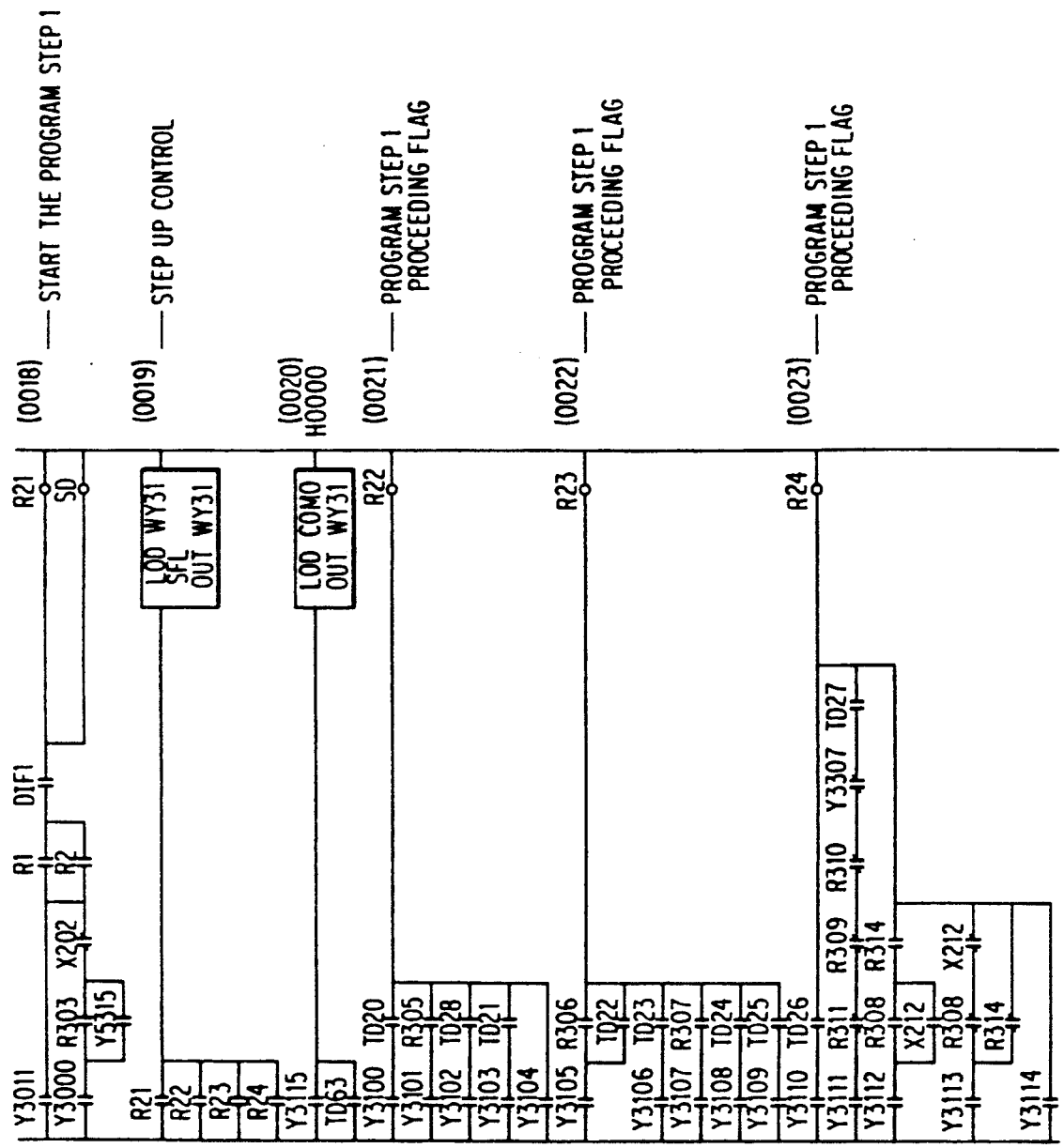
Figure 6B:
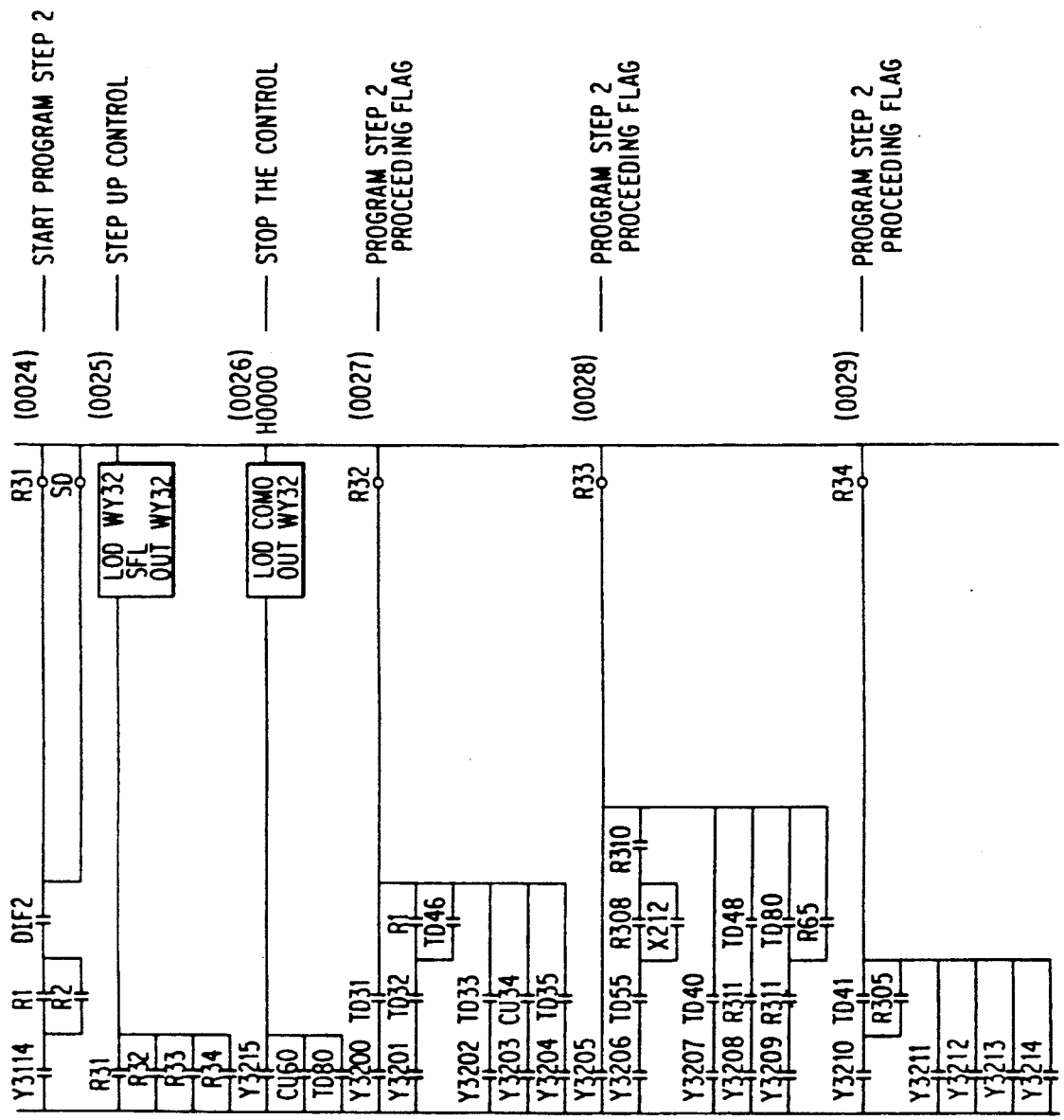
Figure 6C:
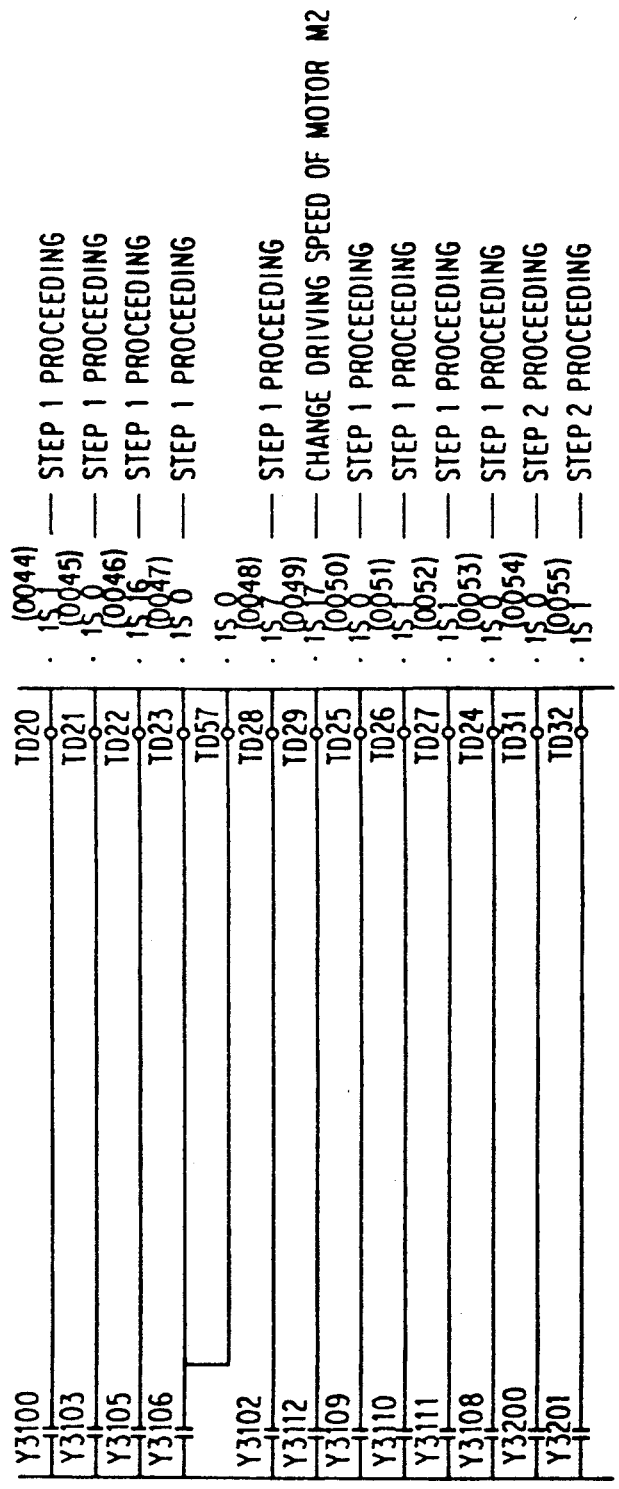
Figure 6D:
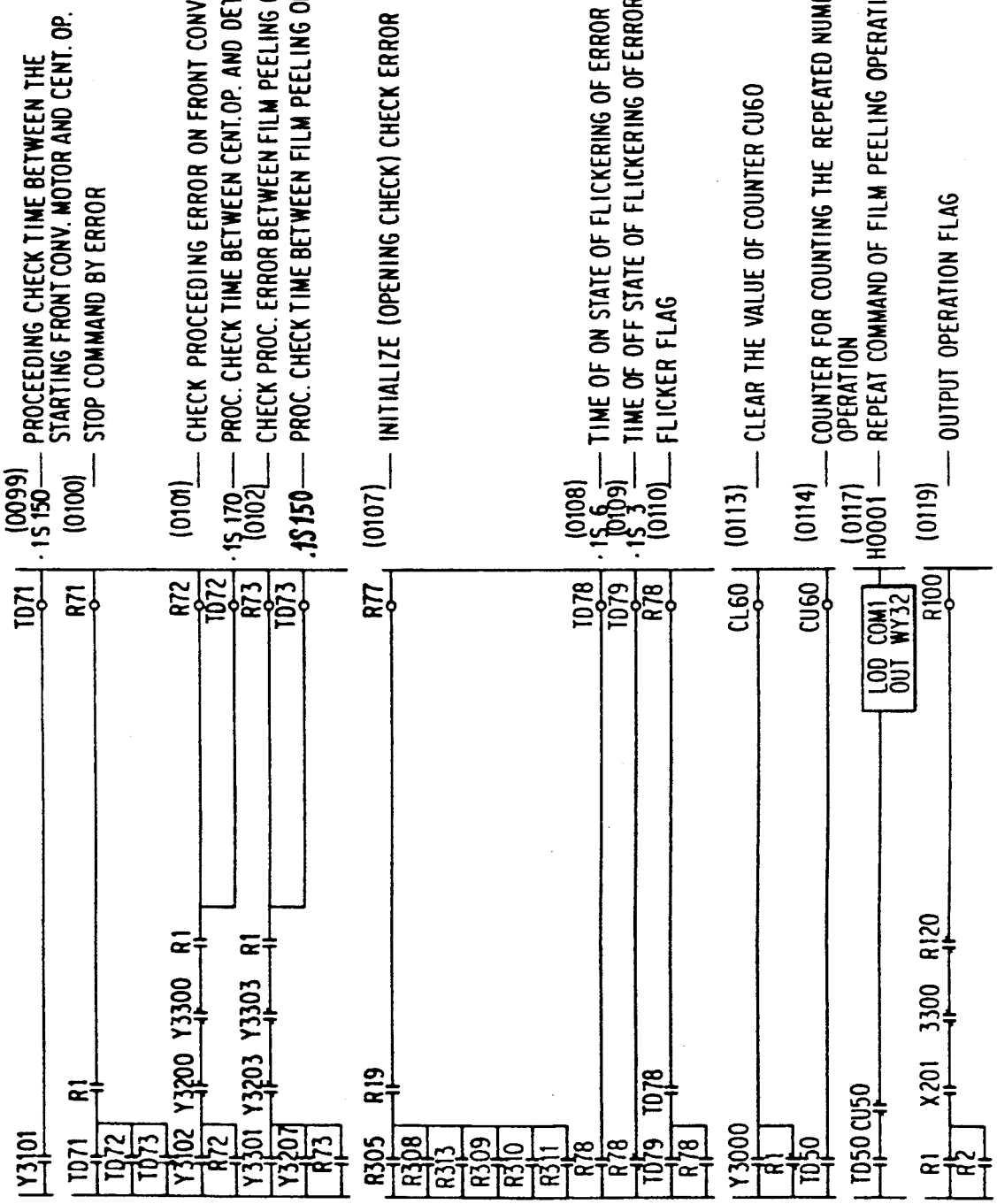
Figure 6E:
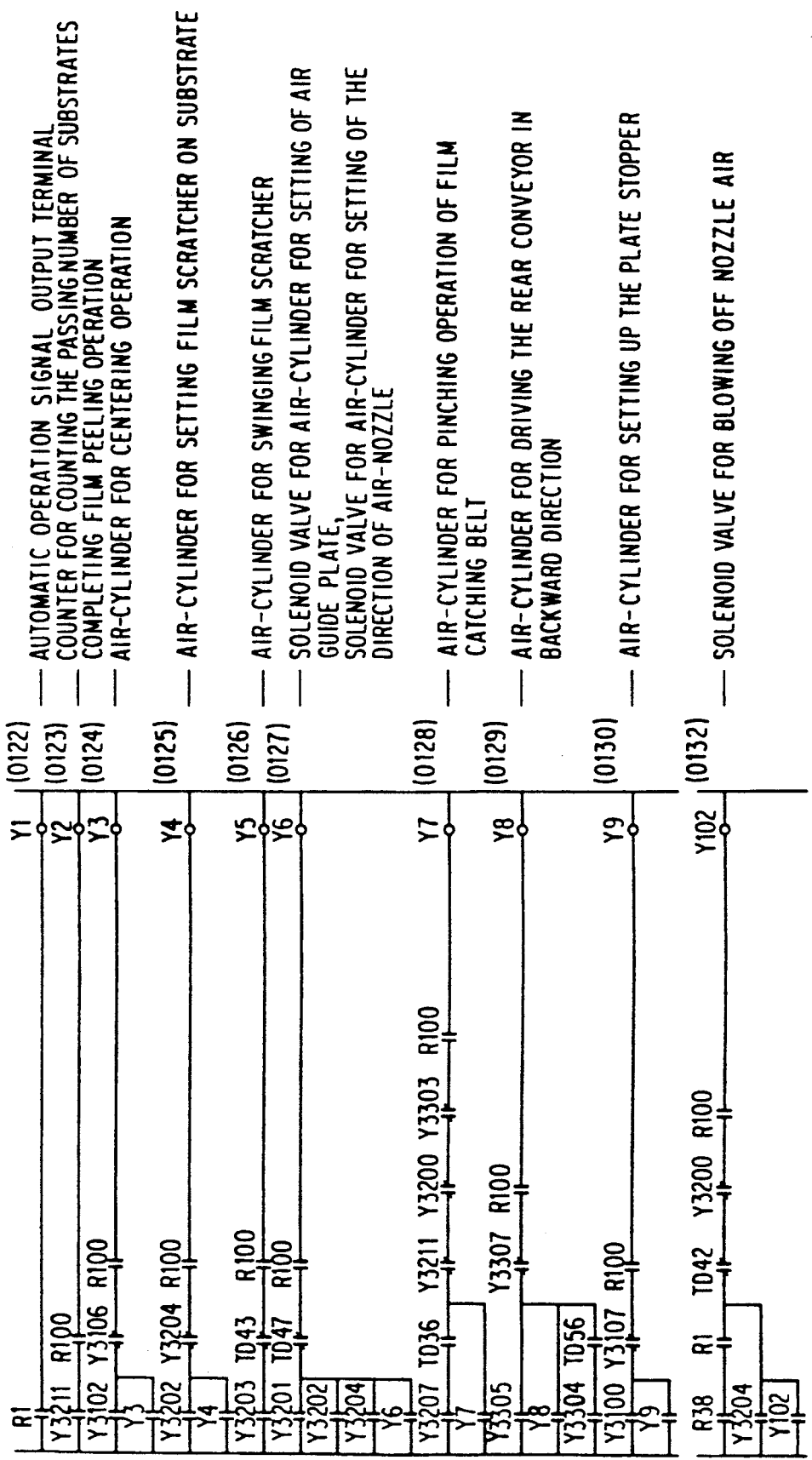
Figure 6E:
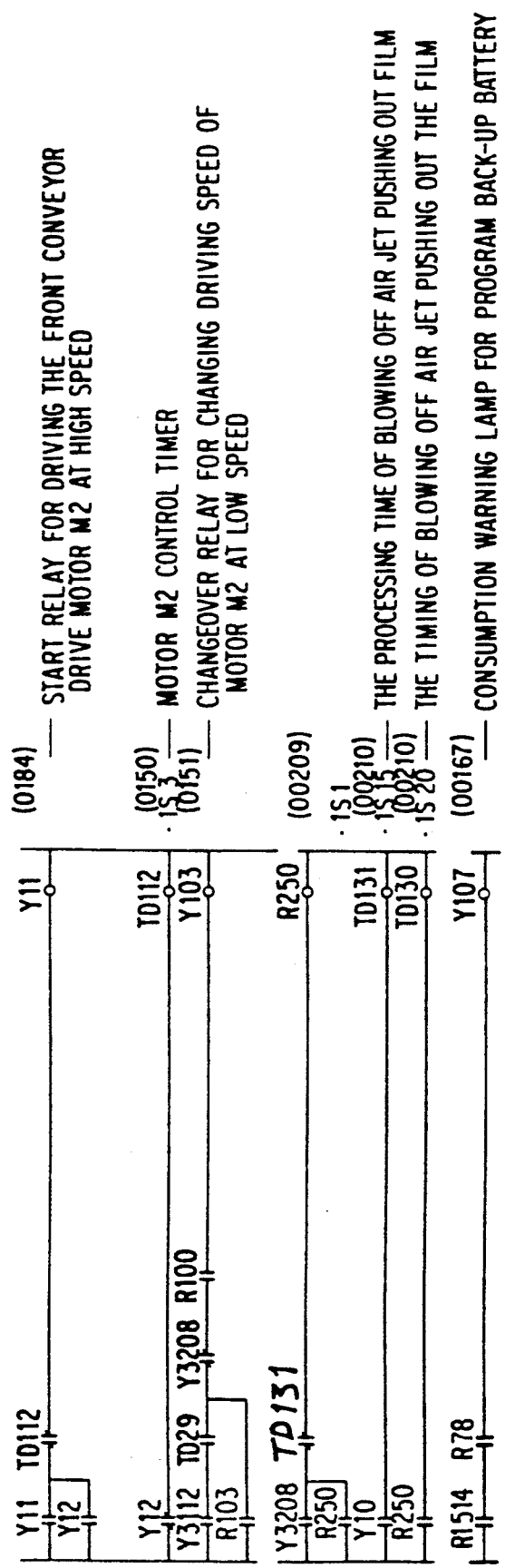

FIG. 5C shows the operating portion of the centering unit. A base plate insertion sensor (BLS) 201 is provided at the inlet portion of the base plate conveyance passage A—A, at which the base plate 1 is conveyed by the upstream conveyor of the apparatus. The base plate centering unit 202, which is base plate sideward movement unit, includes centering pins 202A, which are put into contact with both the side edges of the base plate 1 which extend in the direction of the conveyance thereof, centering pin attaching members 202B for supporting the centering pins 202A, racks 219 and a pinion 220, which kinematically couple the right and the left centering pin attaching members 202B to each other, and backup rollers 221 for guiding the racks 219. A right and a left centering pin attaching members 202C and a centering drive pneumatic cylinder 218, which is a motive power source for centering the base plate 1, are provided further. A centering unit return sensor (WARS) 213 is attached to the body of the cylinder 218 at the piston rod incoming/outgoing side thereof. A base plate left side edge sensor (WALS-1) 210 and a base plate right side edge sensor (WALS-2) 211 are secured over the left and the right centering pins 202A located most downstream of all in the direction A of the conveyance of the base plate 1. A base plate centering start position sensor (WAPS) 203 is attached to the front portion of the upstream conveyor. The upper film peeling sensor (PFS-1) 204 and the lower film peeling sensor (PFS-2) 205 are provided over and under the base plate conveyance passage A—A in order to confirm that the films are already completely peeled from the base plate 1. A base plate passing sensor (BES) 206 is provided near the outlet portion of the film peeling section of the film peeling apparatus in order to confirm that the film peeled from the base plate 1 is in the film conveyance passage. A base plate check sensor (BCS) 208 is provided at the downstream conveyor of the apparatus in order to confirm that there is a base plate from which films have been properly peeled. Shown at 8 and 212 in the drawings are the film edge sensors (FES-1) and a base plate stopper, respectively.

As shown in FIG. 4, an upstream conveyor drive motor 214 is attached to the lower portion of the upstream conveyor of the apparatus. A peeled film discharge guide 209 is provided under the motor 214. A downstream conveyor drive motor 216 is attached to the lower portion of the downstream conveyor of the apparatus. A plurality of backup rollers 207 are provided to push a conveyance roller drive belt. A film conveyance belt drive motor 215 for driving a peeled film discharge belt is attached under the inlet portion of the downstream conveyor near the downstream side of the film peeling section of the apparatus. A peeling-failed base plate sorting accommodation unit 212 is provided under the outlet portion of the downstream conveyor. The unit 212 is a plate conveyance sorting accommodation unit described in the Japanese Patent Application (OPI) No. 154577/88.

Tab. 1 is a list of the input terminals of the programmable logic sequential controller of the film peeling apparatus. Tab. 2 is a list of the output terminals of the controller.

FIGS. 6A, 6B, 6C, 6D, 6E and 6F show programs for the programmable logic sequential controller. In the drawings, Y plus four digits, Y plus three digits, R plus three digits, X plus three digits, TD plus two digits and CU plus two digits denote the bit-joint-use internal output numbers of the controller, the numbers of the outputs from the controller to external devices, the bit word internal output numbers of the controller, the numbers of the input terminals of the controller from the external devices, the internal delay timers of the controller, and the internal counters of the controller, respectively. The digits in the parentheses in the right halves of the drawings denote circuit member, and the digits under the parentheses denote set values for the timers and the counters. As for the timers, ".1S5" denotes $0.1 \sec \times 5 = 0.5$ sec. As for the counters, such symbols denote the maximum counts thereof. Circuit numbers from (0018) to (0023) shown in FIG. 6A indicate a control process from the insertion of the base plate to the detection of the edge of the film. Circuit numbers from (0024) to (0029) shown in FIG. 6B indicate a control process from the peeling of the film to the sending-out of the base plate. Circuit numbers from (0044) to (0080) shown at (a) and (b) in FIG. 6C indicate the setting of the timers and the counters for control steps. Circuit numbers from (0098) to (0119) shown in FIG. 6D indicate a progress error control process. Circuit numbers from (0122) to (0132), those from (0136) to (0139) and those from (0141) to (0151) shown at (a), (b) and (c) in FIG. 6E indicate a controller output terminal control process in the main. Circuit numbers from (0184) to (0202) shown in FIG. 6F indicate an imaginary sensor working time control process.

Figure 7:
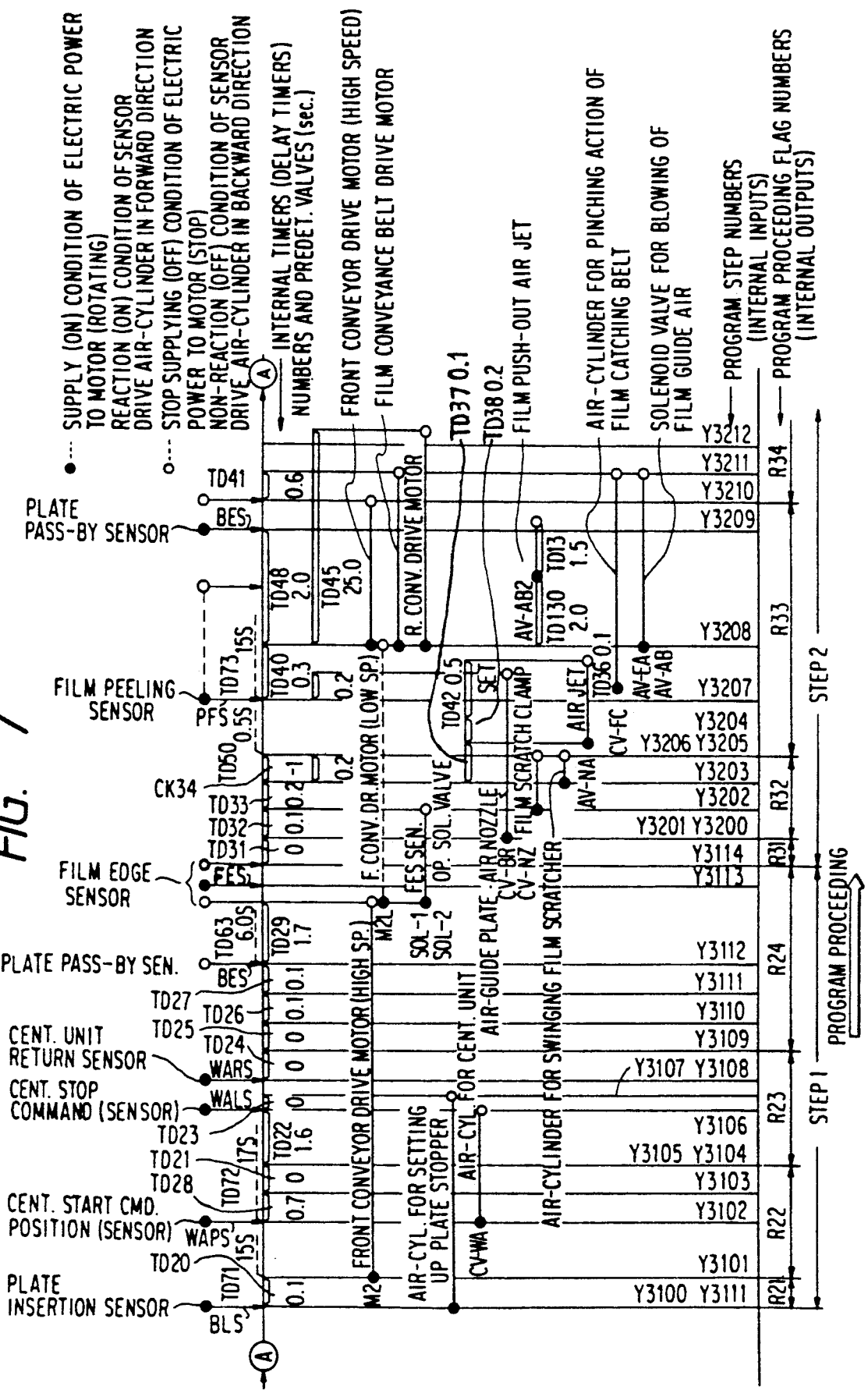
FIG. 7 is a time chart for describing control in the first embodiment.

FIG. 7 is a time chart for describing the control in the film peeling method and the apparatus for practicing it. The method and the apparatus are the first embodiments of the present invention. In FIG. 7, each sign "●" indicates the application of electric power to a motor or the turned-on state thereof, the reaction of a sensor or the turned-on state thereof, or the start of the forward action of a pneumatic cylinder, and each sign "0" indicates the non-application of electric power to the motor or the turned-off state thereof, the non-reaction of the sensor or the turned-off state thereof, or the start of the backward action of the pneumatic cylinder.

The control in the film peeling method and the apparatus for practicing it is described from now on. When a start switch on a control panel 107 is pressed on, the apparatus is put in a stand-by state for automatic operation. At that time, the internal output relays R1 and R15 of the programmable logic sequential controller are both turned on, but the apparatus does not yet begin to move as a whole. When the base plate 1 is inserted from a preceding process into the inlet portion of the upstream conveyor of the apparatus, the base plate insertion sensor (BLS) 201, which is a photoelectric sensor, reacts thereto and is turned on so that the base plate stopper 212 provided downstream of the upstream conveyor is set up. When 0.1 second (TD20) has elapsed after that, the upstream conveyor drive motor 214 starts rotating. When the base plate 1 on the upstream conveyor is conveyed forward so that the base plate centering start position sensor (WAPS) 203, which is a photoelectric sensor, reacts thereto and is turned on, the base plate centering unit 202 starts centering the base plate to cause the center of the width thereof to coincide with that of the width of the upstream conveyor. Namely, a solenoid valve for feeding compressed air to the pneumatic cylinder 218 for moving the centering unit is opened. The base plate 1 is thus conveyed forward on the upstream conveyor and collides against the set-up stopper 212 so that if the leading edge of the base plate extends obliquely to the direction of the conveyance thereof, the edge is corrected to extend rectangularly thereto. When the centering unit 202 has pinched the base plate 1 on both the side edges thereof, the base plate left side edge sensor (WALS-1) 210, which is a photoelectric sensor provided on the push bar 202B of the centering unit, and the base plate right side edge sensor (WALS-2) 211, which is a photoelectric sensor provided on the other push bar 202B of the centering unit, react thereto because the optical axes of the sensors are blocked by both the side edges of the base plate. As a result, the centering unit 202 is put into such reverse action that the base plate push bars 202B thereof are returned to both the sides of the upstream conveyor. When the base plate stopper 212 is dropped down, the base plate 1 is conveyed forward again. The upstream conveyor drive motor 214 continues to rotate since the start thereof. When the base plate centering unit return sensor (WARS) 213, which is a proximity sensor to react in terms of the position of the piston of the pneumatic cylinder 218 for driving the centering unit 202 and is for confirming that the base plate push bars of the centering unit which is a sideward movement unit are returned to both the sides of the conveyor, reacts thereto, the programs for the control are executed sequentially. It is checked whether the base plate 1 already processed remains on the downstream conveyor of the apparatus and whether the film already peeled is not yet conveyed out by the film conveyor of the apparatus but remains on the conveyor. After no trouble is found out through the checking, the control programs are executed further.

When a step is taken at Y3112 in the control programs, the delay timer (TD29) provided in the programmable logic sequential controller is put into action. When the set value (which is usually 1.6 seconds to 2.0 seconds, for example) of the delay timer TD29 has elapsed, the upstream conveyor drive motor 214 is shifted to low-speed rotation and the stylus of the film edge sensor (FES) 8, which is an electrostatic-capacity-reaction-type sensor provided over the base plate conveyance passage A-A so as to detect the leading edge of the film stuck to the base plate, is moved down toward the base plate conveyance passage (the stylus of the other film edge sensor 8 provided under the passage is moved up toward it). When the upstream conveyor moving at a low speed conveys the base plate 1 forward so that the surfaces of copper foils on the base plate come into contact with the styli of the film edge sensors 8 vertically closed to each other, the sensors react thereto and are turned on. When the base plate 1 is conveyed forward further, the surfaces of the films stuck to the copper foils come into contact with the styli of the film edge sensors 8 so that the sensors react thereto and are turned off. When the stylus of the film edge sensor 8 which is the electrostatic-capacity-reaction-type sensor comes into contact with the electroconductive copper foil, the sensor reacts to the electrostatic capacity of the foil on the base plate 1. When the stylus comes into contact with an electric insulator such as the film and air, the sensor 8 does not detect any electrostatic capacity and therefore does not react thereto.

A step is thereafter taken at Y3200 in the control programs. After 0.1 second from the start of the previous step, it is begun that the air blowoff nozzle units 4 are set in such positions as to be obliquely oriented to the leading edges of the films, and the air guide plates 5 are set in positions near the base plate 1. Subsequently, the pneumatic vibration of the tip portions of film scratching heads which are the heads of the film buoy-up members 3 is started and the tip portions are pushed onto the films on the top and bottom of the base plate 1. At the same time, the styli of the film edge sensors 8 are put out of contact with the films or the base plate 1. After 0.1 second from the start of that, it is begun that pneumatic cylinders for moving back the film scratching heads by a prescribed length toward the leading edges of the films or in the same direction as the conveyance of the base plate 1 at a higher speed than the conveyance are then put into action so that the tightness of the contact of the cover film with the photosensitive resin layer is reduced at the leading edges thereof. After 0.1 second from the start of that, it is begun that the compressed air is blown out from the air blowoff nozzle units 4 to the tightness-reduced film at the leading edge thereof for a prescribed time so that the film is buoyed up. When the upper and the lower cover films buoyed up by the air ejected from the nozzle units 4 cling to the air guide plates 5, light emitted from the film peeling sensors (PFS-1 and PFS-2) 204 and 205, which are photoelectric sensors which emit the light to the air guide plates perpendicularly thereto, is reflected by the lustrous flat surfaces of the films so that, the sensors react thereto and are turned on. It is judged from the reaction that the cover films on the top and bottom of the base plate 1 are moved up or down onto the upper and the lower air guide plates 5. After that, the film scratching heads 3 are moved away from the base plate 1, the pneumatic vibration of the tip portions of the heads is stopped, and the heads are moved back in the opposite direction to the conveyance of the base plate.

After 0.1 second (TD36) from the buoying-up of the films, one (6B) of the film pinch belts is moved toward the other belt 6A so that the film buoyed up and clinging to the air guide plate 5 is pinched between both the belts. The air guide lates 5 and the air blowoff nozzle units 4 are then moved away from the surfaces of the base plate 1 back prescribed positions. The upstream conveyor drive motor 214 is shifted back to high-speed rotation. The motor 215 for driving the belt conveyor for conveying the film is started. The downstream conveyor drive motor 216 is started, and film guide air for sending the peeled films is blown out from the fluid ejectors 12 simultaneously. At that time, the rotation speeds of the motors 214, 215 and 216 are regulated so that the upstream conveyor, the downstream conveyor and the belt conveyor are moved nearly at the same speed.

The base plate 1 is transferred from the upstream conveyor onto the downstream conveyor while the cover films are peeled from the photosensitive resin layers on the base plate 1. When the trailing edge of the base plate 1 passes by the base plate passing sensor (BES) 205 (which is photoelectric sensor provided over the inlet portion of the downstream conveyor) so that the sensor reacts thereto and is turned off, the upstream conveyor drive motor 214 is put out of action. After 0.6 second (TD41) from the turning-off of the base plate passing sensor 205, the film conveyance belt conveyor drive motor 215 is put out of action. After 25 seconds from the turning-off of the sensor 205, the downstream conveyor drive motor 216 is put out of action. However, if the following base plate is inserted into the upstream conveyor so that the base plate insertion sensor 201 reacts thereto and is turned on, the actions of the timers for putting the motors 214 and 216 out of action are canceled so that the motors remain in action.

Thus, the execution of the control programs is returned to the first step thereof.

As for the first embodiments of the present invention, the base plate 1 stuck with the films is conveyed to the position of the peeling of the films at the leading edges thereof, as described above. The tightness of the contact of the films with the photosensitive resin layers on the base plate 1 is reduced at the leading edges of the films while the conveyance of the base plate is slowed but not stopped. The efficiency of the peeling of the films is thus enhanced through relatively simple constitution. When the base plate 1 is conveyed to a prescribed position upstream of the position of the peeling of the films at the leading edges thereof, the conveyance of the base plate 1 is slowed and the tightness of the contact of the films with the photosensitive resin layers on the base plate is reduced at the leading edges of the films. For that reason, the tightness can be securely reduced with high positional accuracy. When a means for discharging the film while peeling it is reached by the film while the compressed air is blown to the tightness-reduced portion of the film to peel it, the blowing of the air is stopped so that the consumption of the compressed air is less than that for peeling the whole film only by blowing such compressed air thereto. For that reason, the cost of operation of the film peeling apparatus is diminished. Since the sequential control in the film peeling method is automatically performed, the efficiency of the peeling of the films is enhanced further. Since the base plate 1 is forcibly conveyed when the leading edges of the films are detected and the tightness of the contact of the films with the photosensitive resin layers on the base plate is reduced at the leading edges of the films, the tightness can be more accurately and securely reduced.

The film peeling apparatus including a means for conveying the base plate 1 stuck with the films, a means for reducing the tightness of the contact of the films with the photosensitive resin layers on the base plate at the leading edges of the films without stopping the conveyance of the base plate, a means for blowing the fluid in between the base plate and the tightness-reduced leading edge portions of the films, and a means for discharging the peeled films while peeling the tightness-reduced films includes the base plate insertion sensor 201, the base plate centering start position sensor 203, the film peeling sensors 204 and 205, the base plate passing sensor 206, the film edge sensors 8, the base plate check sensor 208, the base plate centering unit return sensors 213, and a sequential control means which operates on the basis of the output signals from the sensors. For that reason, the apparatus is capable of peeling the films automatically and efficiently.

Figure 9:
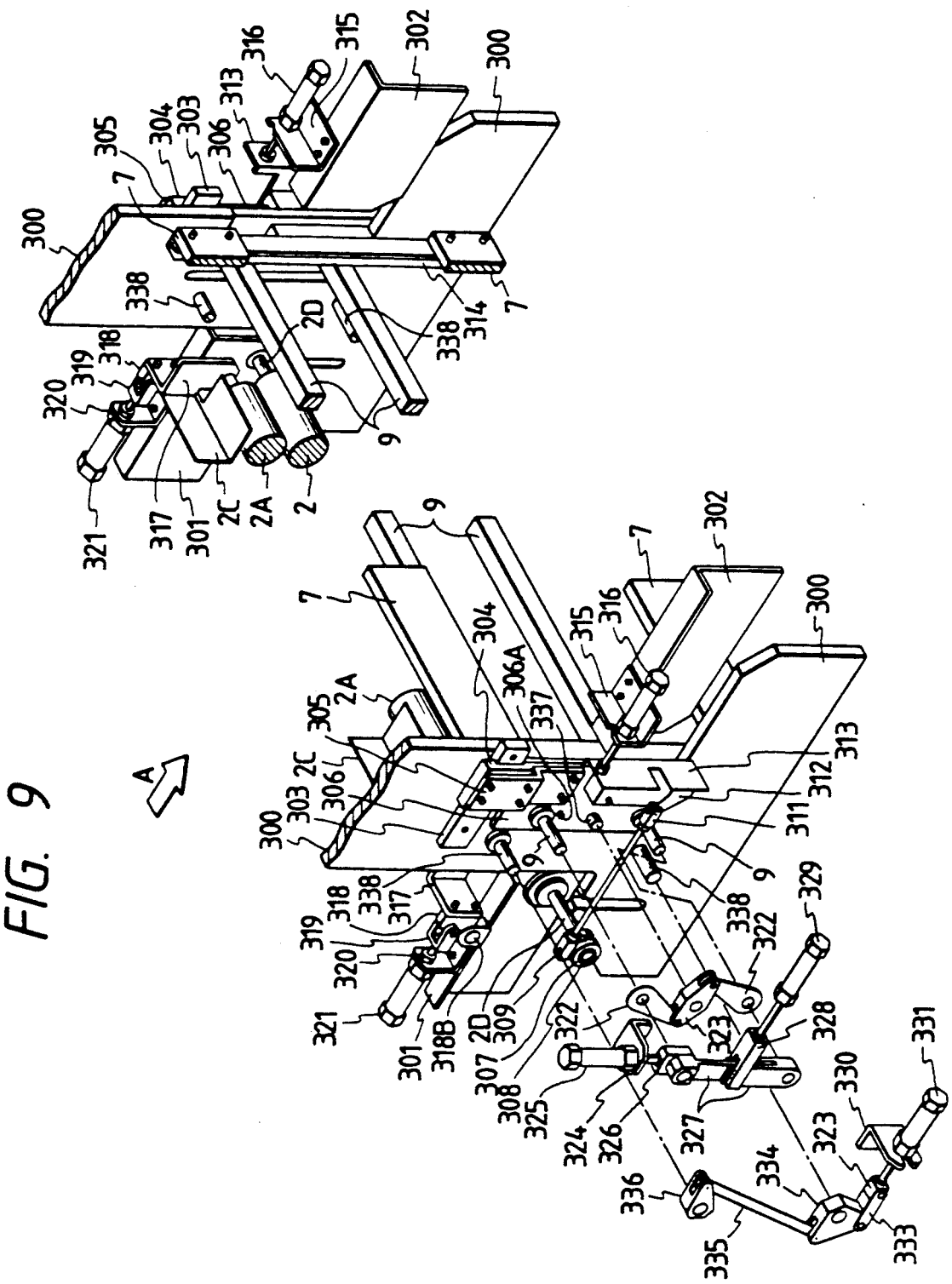
FIG. 9 is a perspective cutaway view of the portion shown in FIGS. 8A and 8B and does not show the film contact tightness reduction mechanism which would be shown in the central part of the drawing.

The second embodiments of the present invention, in which scratchers are moved to make it needless to slow the conveyance of a base plate, are described in detail from now on. The second embodiments are nearly the same in basic constitution as the portions of the first embodiments shown in FIGS. 1, 2A, 2B, 2C, 3A, 3B, 3C, 3D, 3E, 3F, 4, 5A, 5B and 5C, except that a base plate leading edge sensor 19 is provided in the second embodiments and the base plate stopper is not provided therein. Equivalents in the first and the second embodiments are denoted by the same reference symbols herein and not repeatedly described in detail hereinafter. FIG. 8A is a side view of a section which supports a film contact tightness reduction mechanism which operates at a speed synchronized with that of the conveyance of the base plate and is a feature of the second embodiments. FIG. 8B is a view of the section seen along an arrow Y shown in FIG. 8A. FIG. 9 is a perspective cutaway view of the section but does not show the film contact tightness reduction mechanism.

As shown in FIGS. 8A, 8B and 9 guide rails 303 are secured to the upper portions of the right and left body frames 300 of a film peeling apparatus which is one of the second embodiments. Sliding blocks 304 are slidably fitted on the guide rails 303. Support members 305 are secured at one end of each thereof to the sliding blocks 304 and secured at the other ends thereof to the slide plates 306 of sliding parts. Each of the right and the left side plates 306 has upper and lower through holes 306A which are vertically slender holes and through which buoy-up member support rotary shafts 9 extend at both the ends thereof so that the shaft can be moved up and down in the holes. Conjoining members 313 are secured to the side plates 306. Secured plates 312, which support coupling members 311 fitted with coupling bars 310 at one end of each thereof, are secured to the lower portions of the conjoining members 313. Coupling members 309 are attached to the coupling bars 310 at the other ends thereof. Crank members 307 are attached to the coupling members 309, and fitted with one-way bearings 308 on the shaft 2D of a conveyance drive roller 2, which extends through the frames 301 of the upstream conveyor of the apparatus. Electromagnetic clutches may be provided instead of the one-way bearings 308.

As shown in FIG. 9, pneumatic cylinder attaching plates 320 are secured to the tops of the upstream conveyor frames 301. Pneumatic cylinders 321 for an air guide plate 5 and a pinch roller 2A up and down are attached to the attaching plates 320 t one end of each thereof. Support levers 318 for roller push plates 317 and hung plates 2C are rotatably supported at the lower portions of the levers by the attaching plates 320 at the other ends thereof so that the levers can be swung about the supported portions thereof. The piston rods of the pneumatic cylinders 321 are coupled to the support levers 318 at one end of each thereof by coupling members 319. Both the ends of the air guide plate and the hung plates 2C and the roller push plates 317 are located at the ends of the support levers 318 for the hung plates and the roller push plates. The shaft of the pinch roller 2A is rotatably fitted in the roller push portion 317A of the lower portions of the roller push plates 317. Coupling angle members 314 are attached to the right and the left side slide plates 306. To the upper and lower portions of the coupling angle members 314 are secured at both the ends thereof fixed support members 7. Pneumatic cylinder attaching plates 315 are secured to the tops of the frames 302 of the downstream conveyor of the apparatus. Pneumatic cylinders 316 for moving the film buoy-up section of the apparatus are attached to the attaching plates 315. The piston rods of the cylinder 316 are secured to the conjoining members 313 at one end of the each thereof. Moving arms 322 are provided on the buoy-up member support rotary shafts 9 at both the ends thereof outside the right and the left frames 300 of the apparatus body in order that the movement of the upper buoy-up member support rotary shaft toward and away from the plane of the conveyance of the base plate 1 and the movement of the lower buoy-up member support rotary shaft toward and away from the plane are synchronized with each other. The moving arms 322 are coupled to each other by rotary arms 323 having through holes at the centers of the rotary arms. Shafts 337 are rotatably supported by the through holes and secured to the central portions of the side plates 306. FIG. 9 shows the state that the upper and the lower buoy-up member support rotary shafts 9 are moved away from the base plate conveyance plane. Coupling arms 326 and buoy-up member rotation arms 327 are provided on the buoy-up member support rotary shafts 9 at the ends thereof outside the moving arms 322. The central portions of the right and the left body frames 300 have upper and lower through holes in which shafts 338 are rotatably fitted. The shafts 338 function so that a film conveyor for discharging peeled films pinches the films. Arms 336 are secured at one end of each thereof to the upper shaft 338. Arms 334 are secured at the side edge of the central portion of each thereof to the lower shaft 338 and coupled at one end of each of the arms to the other arms 336 at the other ends thereof by coupling members 335. The arms 334 are coupled at the other ends thereof, by coupling members 333, to coupling members 332 attached to the piston rods of pneumatic cylinders 331 which are for pinching the peeled films and are attached to pneumatic cylinder attaching plates 330 secured to the lower parts of the side portions of the body frames 300.

As shown in FIG. 3C, a sensor securing plate 20 is attached at one end thereof to the fixed support member 7 near its portion to which an air blowoff nozzle unit attaching plate 18 is secured. A base plate leading edge sensor 19 is secured to the sensor securing plate 20 at the other end thereof.

Figure 10:
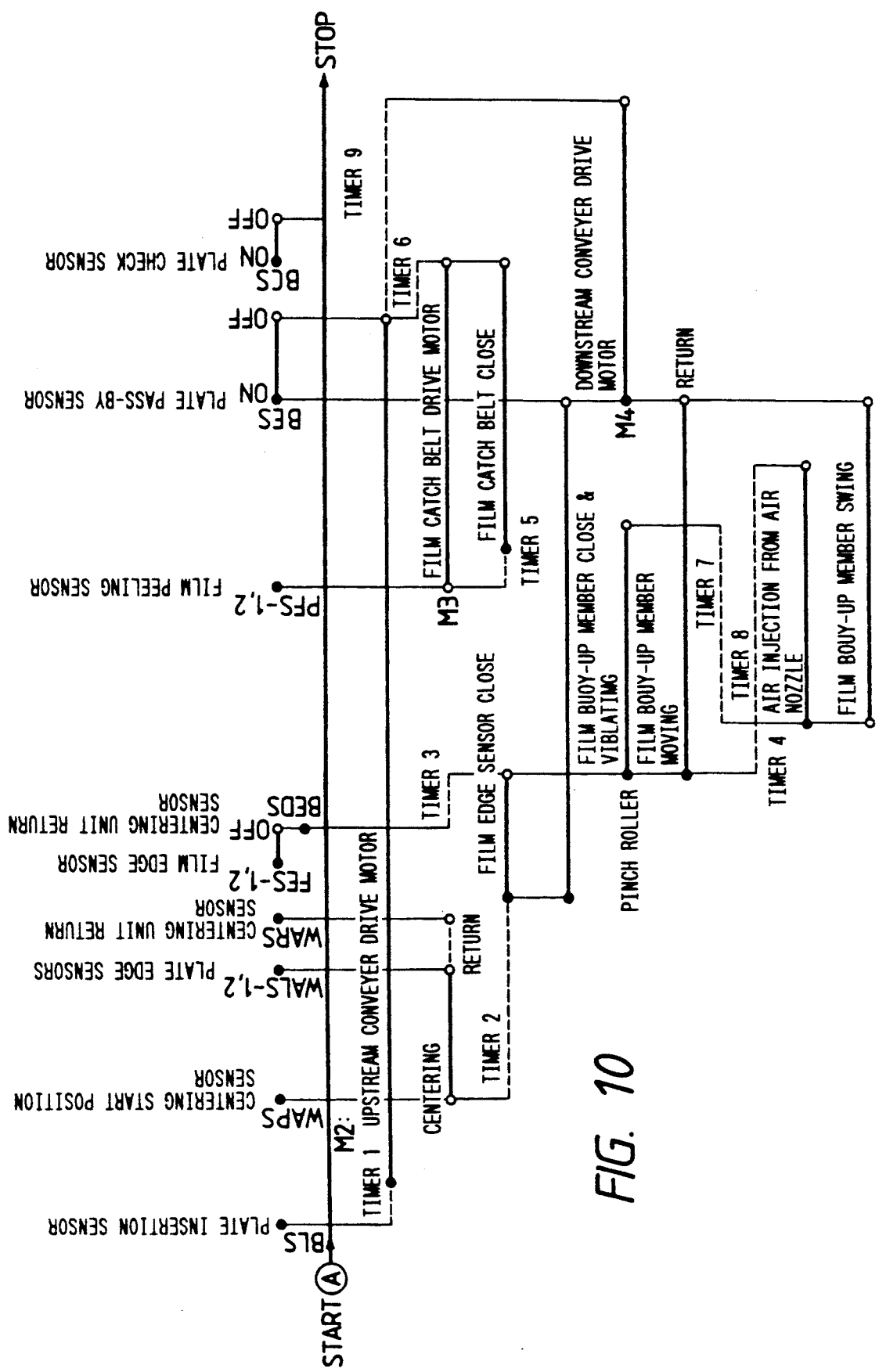
FIG. 10 is a simplified time chart of operation in the second embodiment.

The operation of the film peeling apparatus which is the second embodiment is briefly described from now on with reference to FIG. 10 which is a time chart of the operation. When a start switch on a control panel 107 is turned on, the film peeling apparatus is put in a stand-by state for automatic operation. When the base plate 1 is conveyed from a preceding process and inserted into the inlet portion of the upstream conveyor of the apparatus, a base plate insertion sensor (BLS) 201 provided at the inlet portion detects the base plate so that a timer 1 provided in the programmable logic sequential controller of the apparatus is put into action. When the set time of the timer 1 has elapsed, an upstream conveyor drive motor 214 (M2) is started so that the conveyance rollers 102 of the upstream conveyor begin to rotate to convey the base plate 1 on the rollers. When the leading edge of the base plate 1 conveyed by the conveyor is detected by a base plate centering start position sensor 203 (WAPS), a centering drive pneumatic cylinder 218 is put into action so that a centering unit 202 starts the centering (sideward movement) of the base plate 1 being conveyed. When both the right and left side edges of the centered base plate 1 with regard to seeing in the direction of the conveyance thereof are detected by a base plate right side edge sensor 211 (WALS-2) and a base plate left side edge sensor 210 (WALS-1), the centering of the base plate is stopped. At that time, the right and left centering pins 202A of the centering unit 202 are stopped in the state of pinching the base plate 1 on both the right and left side edges thereof, so that the center of the width of the base plate on the upstream conveyor coincides with that of the width of the conveyor. On the basis of detection signals from the sensors 210 and 211, the centering unit 202 is put into reverse action opposite to the centering action thereof, so that the unit is returned to its original position wherein it was before being put into the centering action. The original position is such a position that a base plate centering unit return sensor (WARS) 213 attached to the centering drive pneumatic cylinder 218 detects the position of the piston of the cylinder in order to stop the centering unit 202.

The base plate 1 is conveyed throughout the centering action of the centering unit 202 and the return thereof to the original position. A timer 2 provided in the programmable logic sequential controller is put into action on the basis of a detection signal from the base plate centering start position sensor 203. When the set time of the timer 2 has elapsed, compressed air is introduced into pneumatic cylinders for vertical movement members 24 for an upper and a lower film edge sensors 8 so that the piston rods of the cylinders are moved toward the conveyance passage A—A for the base plate 1 (FIG. 3F). At that time, the film edge sensors (FES-1 and FES-2) 8 are pushed by the members 24 so that the styli of the tip portions of the sensors are moved toward the base plate conveyance passage A—A and cross with each other without contact with each other. When the set time of the timer 2 has elapsed, the pneumatic cylinders 321 for moving the air guide plate 5 and the pinch roller 2A are put into action so that the roller pushes the base plate 1 and the upper air guide plate is moved down toward the base plate. When the surfaces of copper foils on the base plate 1 come into contact with the styli of the tip portions of the upper and the lower film edge sensors 8, the sensors react thereto and are turned on. When the base plate 1 is conveyed forward further, the surfaces of the films stuck to the surfaces of the copper foils come into contact with the styli of the sensors 8 so that the sensors react thereto and are turned off. Since the sensors 8 are thus shifted from the turned-on state into the turned-off state, the leading edges of the films are detected. If the films are stuck to the whole surfaces of the copper foils on the base plate 1, the film edge sensors 8 are not turned on. For that reason, the base plate leading edge sensor (BEDS) 19 is disposed slightly downstream of the tip of the stylus of the tip portion of the film edge sensor 8 in the second embodiments. When the film edge sensor 8 is turned on during the conveyance of the base plate 1, a base plate edge detection signal sent out from the base plate leading sensor 19 is canceled. When the leading edge of the base plate 1 is detected by the sensor 19 before the film edge sensor 8 is turned on, the base plate edge detection signal sent out from the sensor 19 is put in use. When the leading edge of the film stuck to the base plate 1 or that of the base plate is detected, a timer 3 provided in the programmable logic sequential controller is put into action on the basis of a detection signal generated as a result of the detection. When the set time (which is 0 second to 0.1 second, for example) of the timer 3 has elapsed, the film edge sensors 8 are moved away from the base plate conveyance passage A—A back to the original positions of the sensors. The pneumatic vibration of the tips of film buoy-up members 3, which are the film scratchers, is started, and pneumatic cylinders 325 for vertically moving the buoy-up members are put into action so that the tips of the buoy-up members are pushed onto the surfaces of the films on the top and bottom of the base plate 1 while being vibrated. Each of the pneumatic cylinders 325 is mounted on a bent angle support plate 324 which is in turn fixed to a corresponding frame 300 (see FIG. 9). The period for which the tips of the film buoy-up members 3 are pushed onto the films is set by timers 4 and 7 provided in the programmable logic sequential controller. At the time of the pushing, the pneumatic cylinders 316 for moving the film buoy-up members 3 are put into action so that a film buoy-up unit supported by the sliding blocks 304 begins to move as a whole in the direction of the conveyance of the base plate 1. Since the film buoy-up unit is coupled to a drive shaft for the conveyance rollers 102 of the upstream conveyor by the coupling bars 310, the coupling members 309 and 311, the crank members 307 and the one-way bearings 308, the bearings are engaged at the time of the movement of the unit in the same direction as the conveyance of the base plate 1 so that the unit is moved at a speed synchronized with that of the conveyance of the base plate. When the film buoy-up unit is stopped or moved in the reverse direction, the one-way bearings 308 are not engaged, so that the speed of the upstream conveyor is not changed.

When the film buoy-up unit has begun to be moved at the speed synchronized with that of the conveyance of the base plate 1, the timer 4 provided in the programmable logic sequential controller is put into action. When the set time of the timer 4 has elapsed, pneumatic cylinders 329 for swinging the film buoy-up members 3 are put into action so that the members are swung along the direction of the conveyance of the base plate 1 while the tip portion of the members are vibrated, thus reducing the tightness of the contact of the films with the base plate at the leading edges thereof. As shown in FIG. 9, a forked member 328 is connected to a rod of the pneumatic cylinder 329. At the same time, compressed air is blown out from air blowoff nozzle units 4 to the tightness-reduced edge portions of the films for a prescribed time set by a timer 8 provided in the controller, so that the films are buoyed up from the base plate. When the films buoyed up by the air blown out from the nozzle units 4 cling to the air guide plates 5 because of the flow of the air, the lustrous flat surfaces of the films reflect light to an upper and a lower film peeling sensors 204 and 205 (PSF-1 and PFS-2) so that it is detected that the films extend on the air guide plates. Then the film buoy-up members 3 are moved away from the base plate 1, and the pneumatic vibration of the tip portions of the members is stopped. The film buoy-up unit is pushed back as a whole oppositely to the direction of the conveyance of the base plate 1 so that the unit is returned to the initial position thereof.

A film conveyance belt drive motor 215 is put into action when the films are buoyed up from the base plate so that the upper and the lower film peeling sensors 204 and 205 react thereto. At that time, a timer 5 provided in the controller is put into action. The motor 215 is kept in action since that time. When the set time of the timer 5 has elapsed, a film pinch belt 6B is moved toward another belt 6A so that each buoy-up film clinging to the air guide plate 5 is pinched between the belts and conveyed by them. The air guide plate 5 and the pinch roller 2A are moved away from the surface of the base plate 1 back to the original positions wherein the air guide plate and the roller were before being put into action. A downstream conveyor drive motor 216 is started. Film guide air for discharging the peeled films from the film peeling apparatus is blown out from fluid ejectors 12 simultaneously.

The base plate 1 from which the films are already peeled is transferred from the upstream conveyor of the film peeling apparatus onto the downstream conveyor thereof. When the trailing edge of the base plate 1 passes by a base plate passing sensor 206 (BES) so that the sensor reacts thereto and is turned off, a timer 6 provided in the controller is put into action. When the set time of the timer 6 has elapsed, the upstream conveyor drive motor 214 is put out of action. After a prescribed time from the turning-off of the base plate passing sensor 206, the downstream conveyor drive motor 216 is put out of action. However, if the following base plate is inserted into the upstream conveyor so that the base plate insertion sensor 201 reacts thereto and is turned on, the motors 214 and 216 are not put out of action but remain in action.

Thus, the execution of control programs is returned to the first step thereof.

Although the crank members 307 are provided in the second embodiments so as to move the film buoy-up unit in the same direction as the conveyance of the base plate, racks and pinions may be provided instead of the crank members.

In the second embodiments, the base plate 1 stuck with the films is conveyed to the position of the peeling of the films at the leading edges thereof. The tightness of the contact of the films with the base plate 1 is reduced at the leading edges of the films while the film buoy-up unit is moved at the speed synchronized with that of the conveyance of the base plate and the speed of the conveyance is substantially unchanged. The air is blown in between the base plate and the tightness-reduced films so that the films are automatically discharged while being peeled from the base plate. Thus, the efficiency of the peeling of the films is more enhanced.

The base plate insertion sensor 201, the base plate centering start position sensor 203, the film peeling sensors 204 and 205, the base plate passing sensor 206, the film edge sensors 8, the bas plate leading edge sensor 19, the base plate left side edge sensor 210, the base plate right side edge sensor 211, a base plate check sensor 208, the base plate centering unit return sensor 213, and the sequential control means, which operates on the basis of the output signals from the sensors, are provided. The base plate is conveyed to the position wherein the films are peeled from the base plate at the leading edges of the films. The tightness of the contact of the films with the base plate is reduced at the leading edges of the films while the film buoy-up unit is moved at the speed synchronized with that of the conveyance of the base plate and the speed of the conveyance is substantially unchanged. The air is blown in between the base plate and the tightness-reduced films at the leading edges so that the films are discharged while being peeled from the base plate. The films are thus peeled from the base plate automatically so that the efficiency of the peeling is enhanced.

The present invention is not confined to the embodiments described above, but may be embodied or practiced in other various ways without departing from the spirit or essential character thereof. For example, the present invention can be applied to peel off a film on only one surface of the base plate.

TABLE 1

| Symbol of input terminal | Name of connected device | Function |
|---|---|---|
| X200 | Start button switch | Start switch of automatic operation |
| X201 | Stop button | Stop switch of automatic operation |

TABLE 1-continued

| Symbol of input terminal | Name of connected device | Function |
|---|---|---|
| | switch | |
| X203 | Auto/manutual | Changeover switch of operation mode On for automatic operation Off for manual operation |
| X212 | Single lami | Button switch On for plate with film on one surface Off for plate with films on both surfaces |
| X303 (R303) | BLS sensor | Plate insertion sensor (photoelectric sensor) |
| X305 (R305) | WAPS sensor | Plate centering position sensor (photoelectric sensor) |
| X306 (R306) | WALS-1 sensor, WALS-2 sensor | Sensors for both side edges of plate (photoelectric sensors for commanding stoppage of centering) |
| X307 (R307) | WARS sensor | Centering unit return (original position) sensor (magnetic sensor) |
| X308 (R308) | FES-1 sensor | Film leading edge sensor for upper surface (electrostatic capacity type) |
| X314 (R314) | FES-2 sensor | Film leading edge sensor for lower surface (electrostatic capacity type) |
| X309 (R309) | PFS-1 sensor | Film peeling sensor for upper surface (photoelectric sensor) |
| X310 (R310) | PFS-2 sensor | Film peeling sensor for lower surface (photoelectric sensor) |
| X311 (R311) | BES sensor | Proceeding plate trailing edge sensor (photoelectric sensor) |
| X312 (R312) | MPBS sensor | peeling-failed plate accommodation sensor (photoelectric sensor) |
| X313 (R313) | BCS sensor | Sensor for confirming presence of plate on rear conveyor (photoelectric sensor) |

| Symbol of input terminal | Name of connected device | Function |
|---|---|---|
| Y001 | Y001 relay | Sending-out of automatic operation signal for external device |
| Y002 | External counter | Counting of peeled plate |
| Y003 | CV-WA | Solenoid valve for pneumatic cylinder for centering unfit |
| Y004 | CV-ND and AV-P | Solenoid valve for pneumatic cylinder for pushing of scratcher, and solenoid valve for vibration of tip of the scratcher |
| Y005 | CV-NS | Solenoid valve for pneumatic cylinder for pulling of scratcher |
| Y006 | CV-NZ and CV-BR | Solenoid valve for setting of air nozzle, and solenoid valve for setting of air guide plate |
| Y007 | CV-FC | Solenoid valve for pinching action of film catching belt |
| Y008 | CV-LO | Solenoid valve for control of conveyor for accommodation of peeling-failed plate |
| Y009 | CV-S | Solenoid valve for cylinder for setting up plate stopper |
| Y010 | AV-AB2 | Solenoid valve for film push-out air jet |
| Y012 | MS2A | Electromagnetic switch for front conveyor drive motor M2 |
| Y013 | MS3, AV-EA and AV-AB | Electromagnetic switch for motor M3, solenoid valve for blowing of static electricity elimination air, and solenoid valve for blowing of film guide air |
| Y014 | MS4 | Electromagnetic switch for rear conveyor drive motor M4 |
| Y015 | Yellow warning lamp | Lamp for indication of peeling-failed plate occurance |
| Y102 | AV-NA | Electromagnetic valve for nozzle air jet |
| Y103 | MS2R | Circuit changeover relay for low speed of front conveyor drive motor M2 |
| Y104 | Start indication lamp | Lamp integrated with automatic operation start switch |
| Y105 | Stop indica- | Lamp integrated with automatic operation |

| Symbol of input terminal | Name of connected device | Function |
|---|---|---|
| | tion lamp | stop switch |
| Y106 | Buzzer | Buzzer for indicating peeling failure and error stop |
| Y107 | Battery lamp | Lamp for warning against progress in consumption of battery for keeping program stored in sequential controller |

We claim:

1. A film peeling apparatus comprising:
 a base plate conveyance means for conveying the base plate stuck with the film;
 a base plate centering start position sensor for detecting that the base plate is conveyed forward on the conveyance means and reaches a prescribed position upstream of the position of peeling of the film from the base plate;
 a base plate centering unit which is put into action on the basis of the output from the centering start position sensor for moving the center of the width of the base plate to the center line of the conveyance means;
 a base plate leading edge sensor for detecting a position of a leading edge of the base plate at the film peeling position;
 a film contact tightness reduction means for reducing a contact tightness of a leading edge of the film to said base plate, an operation of said reduction means being started in accordance with the output of the base plate leading edge sensor;
 a fluid blowing means for blowing fluid into gaps between the film end leading edge whose tightness has been reduced by said reduction means and said base plate, to thereby separate the film;
 a support frame on which said reduction means and said fluid blowing means are provided, said support frame being movable in an advance direction of the base plate;
 means for moving said support frame for a prescribed time period in synchronism with the rotation of base plate conveyance rollers so that the conveyance speed of the base plate is kept substantially unchanged during the film tightness reduction operation;
 a film peeling sensor for detecting that the separated film has entered into a film discharge passage; and
 a film pinch means for discharging the film while pinching the separated film and peeling the separated film from the base plate;
 wherein said support frame moving means includes a crank means for being driven in synchronism with the rotation of said base plate conveyance rollers; and
 wherein said crank means includes a crank member connected at one end to said support frame, and a one-way clutch mechanism for synchronizing, during the film tightness reduction operation, the movement of the crank member and the rotation of the base plate conveyance rollers with each other.

2. The film peeling apparatus according to claim 1, wherein the base plate leading edge sensor is located in the vicinity of said film edge sensor.

3. The film peeling apparatus according to claim 1, wherein said base plate conveyance means includes base plate pinch rollers for conveying said base plate under pressure, and means for depressing said pinch rollers against the base plate by driving said pinch rollers in accordance with the output of the base plate leading edge sensor and releasing the pressure in a predetermined period of time.

* * * * *